United States Patent [19]

Goncharoff et al.

[11] 4,287,599
[45] Sep. 1, 1981

[54] MULTI-CHANNEL COMMUNICATION DEVICE WITH MANUAL AND AUTOMATIC SCANNING ELECTRONIC CHANNEL SELECTION

[75] Inventors: Nikolai Goncharoff, Hoffman Estates; Dennis M. Puntil, Melrose Park, both of Ill.

[73] Assignee: Motorola, Inc., Schaumburg, Ill.

[21] Appl. No.: 5,544

[22] Filed: Jan. 22, 1979

Related U.S. Application Data

[63] Continuation of Ser. No. 711,036, Aug. 2, 1976, abandoned.

[51] Int. Cl.³ .................. H04B 1/44; H03J 7/32
[52] U.S. Cl. .................................. 455/77; 455/78; 455/158; 455/166; 455/175; 307/112
[58] Field of Search .............. 307/112, 113, 115, 239; 455/76–79, 158, 160, 161, 165, 166, 175

[56] References Cited

U.S. PATENT DOCUMENTS

| | | | |
|---|---|---|---|
| 3,497,813 | 2/1970 | Gallager | 325/470 |
| 3,614,621 | 10/1971 | Chapman et al. | 325/469 |
| 3,617,895 | 11/1971 | Tomsa | 325/470 |
| 3,750,032 | 7/1973 | Andrews | 325/470 |
| 3,801,914 | 4/1974 | Imazeki | 325/470 |
| 3,803,494 | 4/1974 | Howell et al. | 325/469 |
| 3,832,636 | 8/1974 | Kubo | 325/470 |
| 3,845,394 | 10/1974 | Hamada | 455/160 |
| 3,890,574 | 6/1975 | Nakano et al. | 325/470 |
| 3,919,646 | 11/1975 | Morgan | 325/470 |
| 4,027,251 | 5/1977 | Fathauer et al. | 325/470 |
| 4,081,752 | 3/1978 | Sumi | 455/165 |

Primary Examiner—Jin F. Ng

Attorney, Agent, or Firm—Phillip H. Melamed; James W. Gillman

[57] ABSTRACT

A transceiver is disclosed that has a manual scanning electronic channel selection switch with a single actuator that can readily select any one of a predetermined plurality of discrete channels by step tuning the transceiver to each of the discrete channels in either an up or down scanning sequence. An up and down scan actuator is mounted to the housing of the transceiver and another is attached to the microphone of the transceiver, thus providing for remotely tuning the transceiver when access to the transceiver housing is inconvenient. The transceiver is selectively tuned by use of a phase lock loop having a programmable divider that is controlled by a counter which counts clock pulses during up and down scan tuning. An illegal channel detector is provided which prevents the counter from selecting a channel which does not correspond to one of the selectable channels.

The transceiver has apparatus for automatically sequentially scanning a plurality of priority channels and, if signals are received on a scanned channel, producing audible signals related to these received signals, the automatic scanning being temporarily discontinued while priority signals are received. Apparatus for monitoring a nonpriority channel, such as a standard AM broadcast band channel, is also provided.

Apparatus is disclosed which totally prevents any manual or automatic tuning of the transceiver during signal transmission by the transceiver. Every time power is initially supplied to the transceiver, the transceiver will be automatically tuned to a single preselected channel.

30 Claims, 11 Drawing Figures

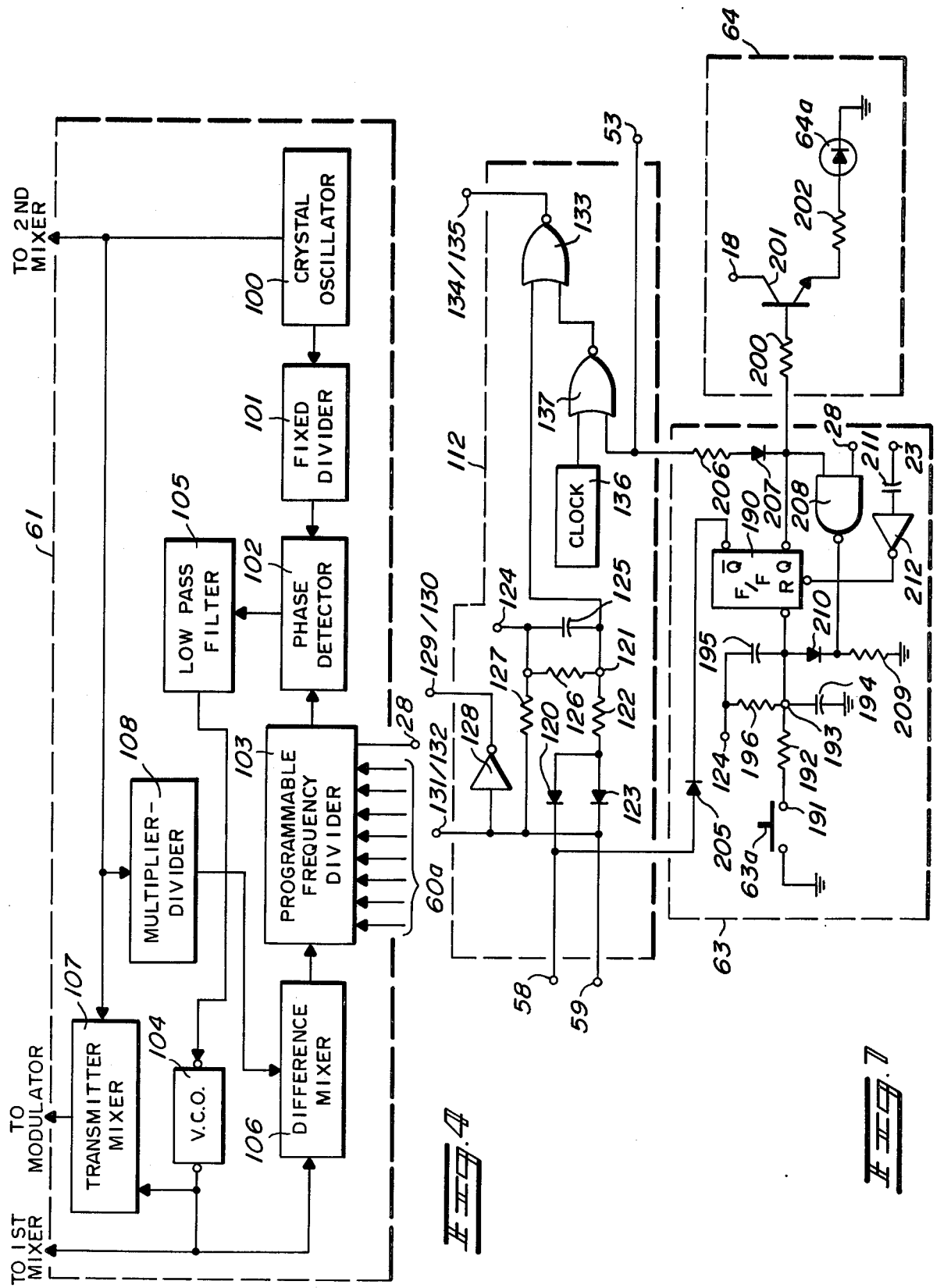

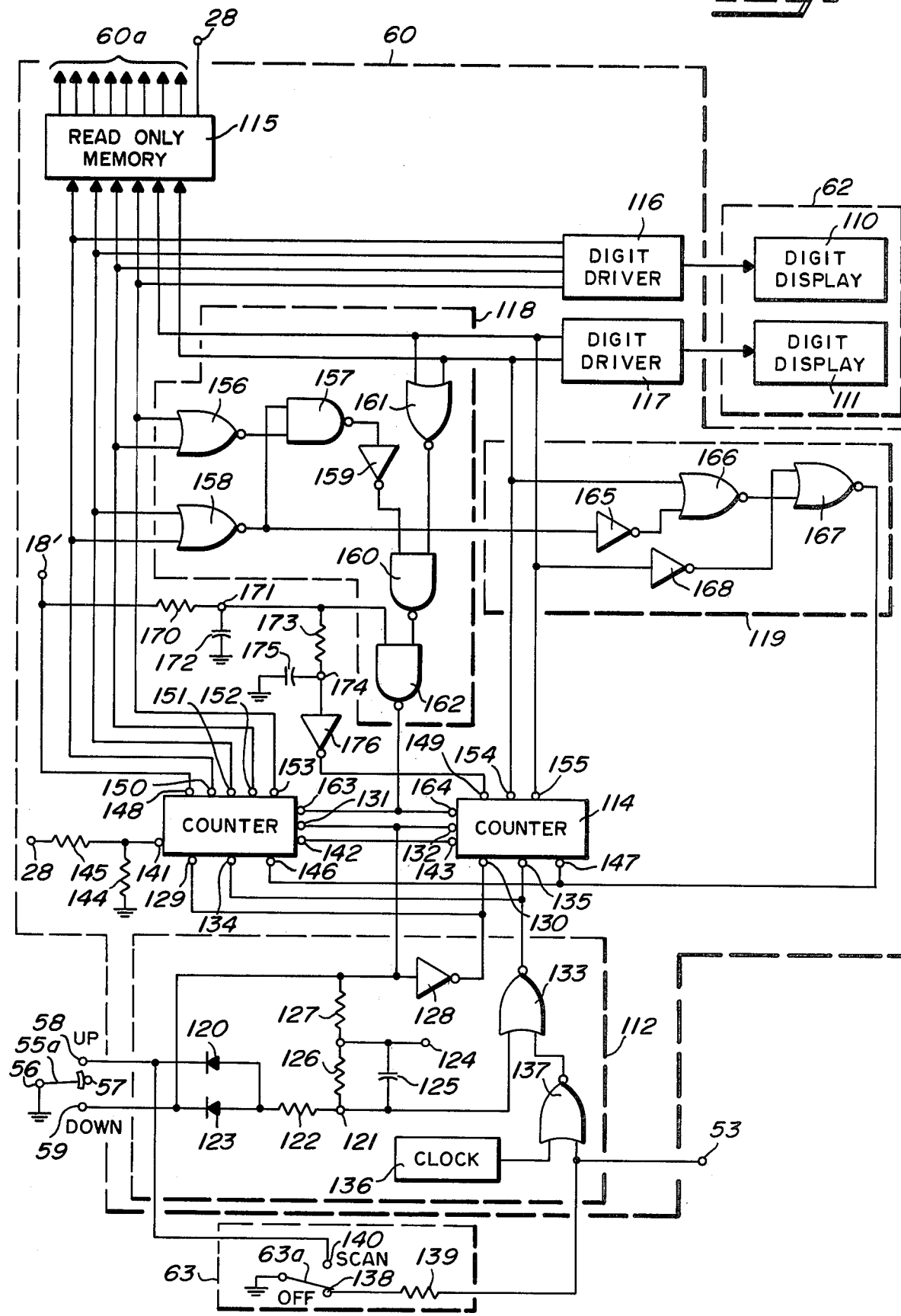

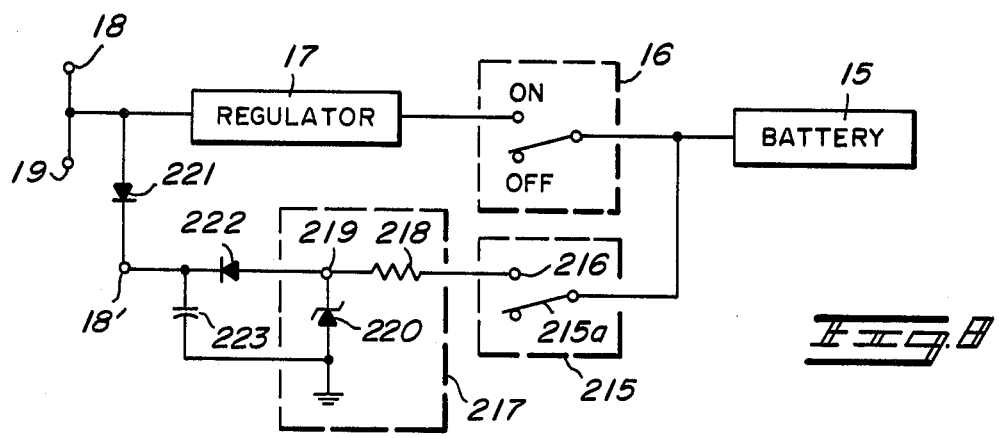
Fig. 8
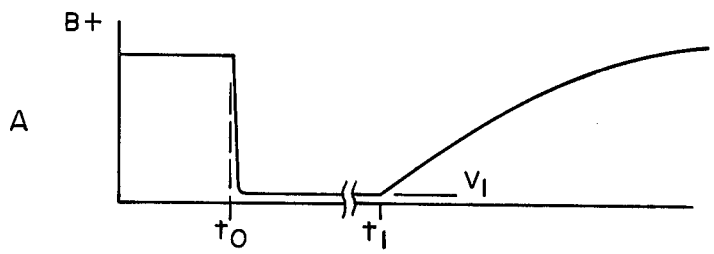
Fig. 9
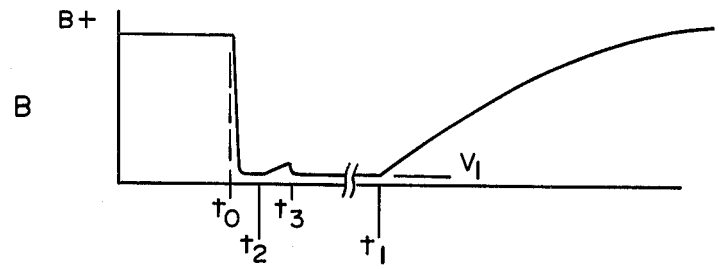
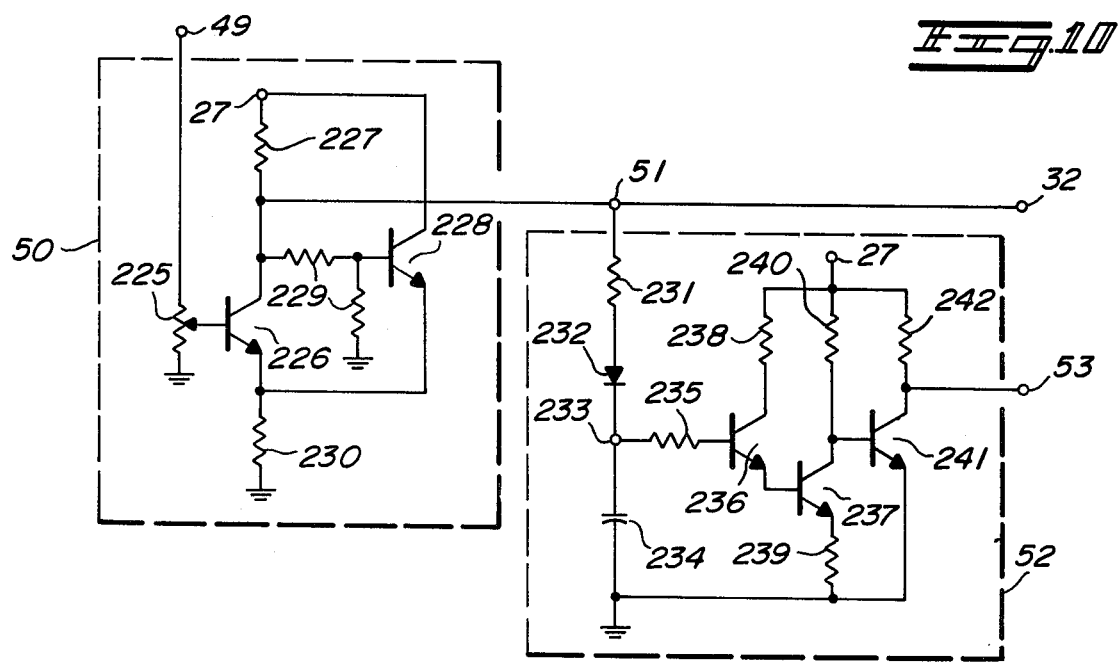
Fig. 10

MULTI-CHANNEL COMMUNICATION DEVICE WITH MANUAL AND AUTOMATIC SCANNING ELECTRONIC CHANNEL SELECTION

This is a continuation of application Ser. No. 711,036, filed Aug. 2, 1976 now abandoned.

BACKGROUND OF THE INVENTION

The invention generally relates to the field of multi-channel communication devices which are operable at a predetermined plurality of discrete channel frequencies. More particularly, the invention relates to multi-channel communication devices which have step scanning electronic channel selection that either manually or automatically selects one of a predetermined plurality of discrete channel frequencies at which the communication device is operable at.

The most common way to step tune a multi-channel communication device to a plurality of discrete channel frequencies is to use a multi-position rotary mechanical switch which has a different mechanical position for each channel to be selected. This type of prior art mechanical switch is generally used in conjunction with a plurality of different crystals, channel elements, which are selectively actuated according to the position of the multi-position mechanical switch. Multi-position mechanical switches are commonly used as the tuning mechanisms for television sets and citizens band (CB) transceivers.

Some prior art communication devices comprise receivers which are continuously manually or automatically swept tuned across an entire frequency band, the frequency sweeping being terminated when the receiver comes across a desired frequency having a transmitted signal thereon. This type of automatic continuous tuning action, by itself, is totally unsuitable for tuning the receiver to a predetermined channel since if a predetermined channel does not have a signal transmission on it this prior art circuit cannot tune the receiver to the channel. In addition, such continuous tuning is not practical or desireable when the communication device includes a transmitter which must operate at only a predetermined plurality of highly stable discrete channel frequencies.

Automobile car telephone systems have radio equipment which does continually scan a plurality of discrete channel frequencies by sequentially tuning a receiver to each of these frequencies. However, these scanning systems only scan in one direction and are generally fully automatic and do not lend themselves to the use of a manual actuator. In addition, the electronics of the mobile car telephone system is basically concerned with finding open channels and not detecting the presence of a priority channel transmission and producing audible signals in response thereto. Thus standard car telephone equipment cannot tune a radio to a desired predetermined channel.

When a mechanical multi-position switch is used to select one of a predetermined plurality of stable frequency discrete channels, the channel to which the communication device is tuned when power is reapplied to the communication device is the channel that was last previously selected by the mechanical multi-position switch. To have the communication device automatically tuned to a single calling channel whenever power is reapplied to the communication device would be impractical with the prior art switches. Mechanical multi-position switches are generally not reset to one specific channel upon the reapplication of power to a communication device and this function could not be implemented without the use of expensive mechanical drive mechanisms to rotate the multi-position mechanical switch. Electronic tuning systems have generally retained the channel memory function of the multi-position mechanical switch, and no prior art system has enabled the operator of the communication device to select either a previous channel memory function or a calling channel reset function for initially tuning his communication device upon the reapplication of power to the device.

Automatic scanning tuning systems have been provided for communication devices. However, these automatic tuning systems generally latch on to one of a predetermined plurality of channels and further scanning cannot be obtained until the termination of the automatic scanning mode or the termination of signals on the locked in channel. Prior art systems generally do not provide any way for the operator to maintain automatic scanning while manually overriding the automatic scanning when signals on an undesired one of the plurality of channels are being received.

Prior art communication devices which are manually tunable and include transmitter apparatus generally have no apparatus which positively prevents the selection of a different transmitter channel frequency during the transmission of signals by the transmitter. Thus in prior art devices the transmitter channel frequency can be changed during transmission by use of the manual tuning control. Such operation is always undesireable and results in either transmitting on an unintentionally selected channel, creating large transient voltages in the transmitter or possibly creating the transmission of transient frequencies which lie outside of the allowed frequency range for any of the operable channels at which the communication device can operate. Prior art devices provide no way to prevent manually changing the transmitter frequency during the transmission of signals by the transmitter.

Switch bounce eliminator circuits are commonly available and are generally used to provide a response to the movement of a switch actuator which closes a contact. They provided for ignoring and ignores any slight discontinuity in the closure of the contact which may occur directly after the movement of the actuator. This slight discontinuity is referred to as switch bounce. Typically, switch bounce circuits comprise a delay circuit and a Schmidt trigger circuit connected in combination such that the control signal produced in response to the actuator movement is substantially delayed from the time that the switch contact is initially closed. Thus prior art bounce eliminator circuits have not rapidly responded to a switch closure and ignored subsequent discontinuities, but have basically ignored the initial switch closure and the subsequent discontinuity and then produced a control voltage only in response to a subsequent continuous switch closure. These prior art bounce eliminator circuits generally comprise a plurality of logic gates and are relatively expensive. In addition, they do not rapidly respond to the initial movement of the switch actuator. When switches are used to control the manual tuning of a multi-channel communication device, it is desireable that a tuning control signal be rapidly created in response to the movement of a manual tuning actuator, while minimizing the effect of switch bounce. Prior art tunable communication devices have generally totally ignored the effect of switch bounce on tuning switches and thus the tuning of these prior art communication devices is subject to initial variability and slow response because of the existence of switch bounce transients.

SUMMARY OF THE INVENTION

An object of the present invention is to provide an improved multi-channel communication device with a scanning electronic channel selection switch.

A more particular object of the present invention is to provide a multi-channel communication device manually tunable with a single actuator for scanning a predetermined plurality of discrete channel frequencies by step tuning to each of said discrete channel frequencies in discretes steps in either of two distinct channel scanning sequences.

A further object of the invention is to provide an improved multi-channel communication device having manually actuated channel tuning controls, one manual tuning control mounted to the housing of the communication device and another tuning control remotely located with respect to the housing of the communication device.

A more detailed object of the present invention is to provide an improved multi-channel transceiver having at least two manually actuated up down tuning scan switches, one switch located on the housing of the transceiver and one located on the transceiver microphone.

Another object of the present invention is to provide an improved multi-channel communication device which continually scans a plurality of priority channels which producing audible signals related to the signals received on a non-priority channel if no priority channel transmissions are detected.

Still another object of the present invention is to provide a multi-channel communication device having a transmitter which is manually tunable to a plurality of different channel frequencies, the manual tuning means being unable to change the transmitter channel frequency during the transmission of signals by the transmitter.

An additional object of the present invention is to provide a multi-channel communication device which is automatically tuned to one of a predetermined plurality of channels when power is supplied to the device, regardless of which channel the communication device had been tuned to when power had last been supplied to the communication device.

A more detailed object of the present invention is to provide a multi-channel communication device which, when rendered operative, either is tuned to the same frequency channel that the device was tuned to when it was previously operative or is tuned to a predetermined channel frequency regardless of the channel that the device was previously tuned to, the communication device having circuitry for selectively implementing either of the two previous tuning functions in accordance with the desires of the operator of the multi-channel device.

An additional object of the present invention is to provide a multi-channel communication device having a manually actuated tuner and an improved bounce eliminator circuit for the tuner.

A further additional object of the present invention is to provide an improved bounce eliminator circuit adaptable for use in tuning a multi-channel communication device.

In one embodiment of the present invention a multi-channel communication device operable at a predetermined plurality of discrete channel frequencies is provided. The communication device includes a generating means for selectively producing, in response to control signals, one of a predetermined plurality of discrete channel signals. Each of these channel signals has a different frequency and the one selectively produced channel signal determines the operative frequency of the communication device. A visual indication means produces a display which identifies the operative channel frequency of the communication device. A first switch means is provided for manually tuning the multi-channel communication device. This first switch means has a manual actuator that has at least a first and second mechanical position. The first switch means provides an up control signal with its manual actuator in the first mechanical position, a down control signal with the manual actuator in its second position, and an enable control signal with the manual actuator in either of the first or second positions. The generating means receives these control signals from the first switch means and in response thereto continuously selectively generates, in discrete steps in a first predetermined sequence, each of the discrete channel signals which can be produced by the generating means as said one channel signal in response to the existence of both the enable and up control signals. The generating means continuously selectively generates, in discrete steps in a second predetermined sequence, each of the discrete channel signals producable by the generating means as said one channel signal in response to the existence of both the enable and down control signals. The up and down signals thereby select one of the first and second sequences and the enable signal enables the generator means to selectively generate another of said predetermined channel signals as said one channel signal. The above structure provides for readily selecting any of the allowable channel signals as the one selectively generated channel signal by having a single actuator cause any one of two distinct channel scanning sequences for the generating means.

The present invention provides for locating one of the previously mentioned switch means on the housing of the multi-channel communication device and locating another one of these switch means at a location remote from the housing. This allows the operator of the multi-channel communication device to tune the device from a remote location whenever access to the switch means mounted to the housing of the communication device is inconvenient.

The present invention provides a channel select switch on the microphone of a transmitter and this allows efficient channel selection prior to transmission.

Switch bounce eliminator circuitry is provided for the switch means previously described. The switch bounce circuitry includes a first resistor having a magnitude, a first end terminal coupled to a first voltage potential and a second end terminal. A capacitor is coupled between the second end terminal of the resistor and a reference voltage potential. With the switch means in either of the first and second positions, a low resistance path substantially less than the magnitude of the first resistor is provided between the second end terminal and a second voltage potential which is different from the first voltage potential. With the switch means in a third position, a high resistance path substantially greater than the magnitude of the first resistor is provided between the second end terminal and the second voltage potential. This configuration produces a rapid change in the voltage at the second end terminal in response to the actuator being initially moved from the third mechanical position to either of the first or second mechanical positions. Switch bounce which may occur upon the movement of the actuator into these first and second positions will not substantially effect the voltage at the second end terminal due to the capacitor and the fact that a high resistance path will be provided during switch bounce. The voltage at the second end terminal is used as a control voltage and determines the enable signal which controls the tuning of the multi-channel communication device. The bounce eliminator circuitry has applications independant of its use in multi-channel communication device tuning assemblies.

The present invention provides for receiving nonpriority communications while continually scanning a receiver over a predetermined plurality of priority communication channels in search of any priority communication transmissions. Once a priority communication is received, further channel scanning is inhibited and audible signals are produced in response to the priority channel signal while the audible signals related to the nonpriority channel signal are interrupted.

The present invention also provides for disabling the manual tuning of a transmitter whenever the transmitter is operative. Thus changes in the transmitter channel frequency are prevented during the transmission of signals by the transmitter. In addition, actuation of the transmitter will also prevent any automatic transmitter channel tuning from being effective.

The present invention also provides for resetting the channel to which a multi-channel communication device is tuned so that after operative power is initially supplied to the multi-channel communication device, the device is always initially tuned to a preselected channel, regardless of the channel which the device had previously been tuned to. Provision is also made for having the operator select either the previously mentioned preselection tuning or having the communication device remember the channel to which it had previously been tuned to and retune to this channel upon the supplying of operative power to the device.

In the preferred embodiment of the present invention, the tuning of the multi-channel communication device is dependant upon the count of a counter which controls the programmable frequency division of a divider in a phase lock loop. Many advantages are obtained by the use of specific circuits which implement the previously mentioned broad functions. The specific structures which create these advantages are explained in detail in the description of the preferred embodiment of the invention and aid in accomplishing all of the previously mentioned objects of the present invention. Since there are a number of these specific circuits they will be discussed subsequently with specific reference to the preferred embodiment of the present invention. However, the scope of the present invention is to be determined from the statement of the invention as embodied in the subsequent claims.

BRIEF DESCRIPTION OF THE DRAWINGS

For a more complete understanding of the invention reference should be made to the drawings in which;

FIG. 4 is a detailed block diagram of illustrating the typical configuration for another one of the component blocks shown in FIG. 1;

FIG. 5 is a detailed combination schematic and block diagram of typical embodiments of several of the components illustrated in FIG. 1;

FIG. 7 is a combined block and schematic diagram illustrating another circuit design for the circuitry shown in FIG. 6;

FIG. 8 is a combined block and schematic diagram illustrating a typical circuit design for a tuning channel memory and/or tuning channel preselect circuit which may be incorporated into the multi-channel communication device illustrated in FIG. 1;

FIGS. 9A and 9B are graphs illustrating the control waveforms produced by an improved bounce eliminator circuit contained in the multi-channel communication device illustrated in FIG. 1, the bounce eliminator circuitry being illustrated in greater detail in FIGS. 5 through 7; and FIG. 10 is a schematic diagram illustrating a typical embodiment of two of the component blocks illustrated in FIG. 1.

DESCRIPTION OF THE PREFERRED EMBODIMENT

Figure 1:
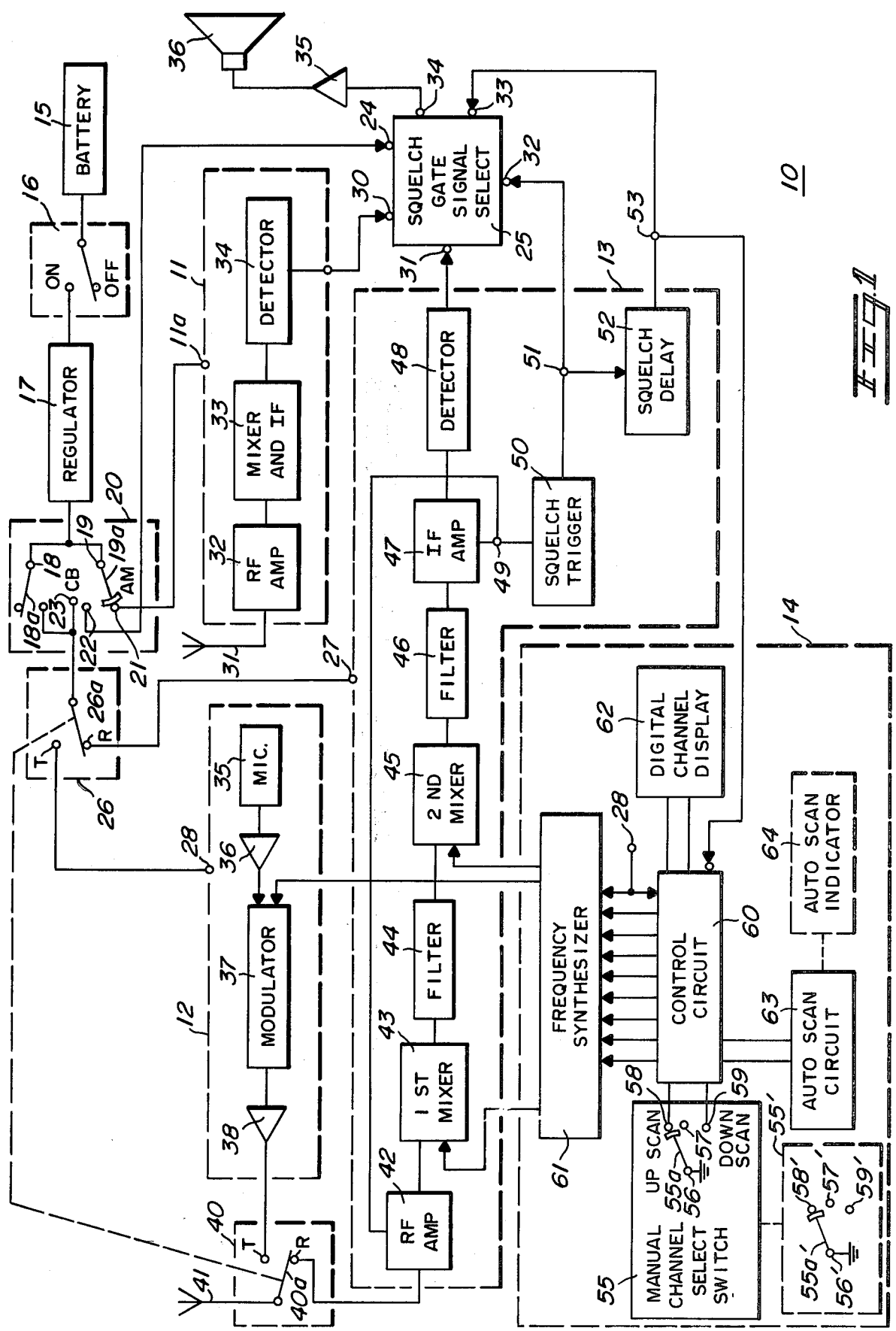
FIG. 1 is a schematic and block diagram of a multi-channel communication device which is manually tunable.

FIG. 1 illustrates a multi-channel communication device 10 which basically includes an AM radio receiver 11 (shown dashed), a citizens band (CB) transmitter 12 (shown dashed), a citizens band receiver 13 (shown dashed), a tuning control circuit 14 (shown dashed) for the CB transmitter 12 and receiver 13, and various control circuits for controlling the operative modes of the communication device 10. The multi-channel communication device 10 is contemplated as typically being installed in a vehicle, such as an automobile.

Operative power for the communication device 10 is supplied by a battery 15 which is coupled to an on-off switch 16 (shown dashed). Switch 16 is illustrated as a two position switch and when the switch is in an on position, it supplies operative power, typically a positive voltage, to a voltage regulator circuit 17 that supplies a regulated voltage to terminals 18 and 19 of a mode selector circuit 20 (shown dashed). The battery 15, the on-off switch 16, and the regulator 17 merely function to selectively deliver, when switch 16 is on, a regulated voltage to the terminals 18 and 19 of the mode selector circuit 20.

The mode selector circuit 20 basically selects three modes of operation for the multi-channel communication device 10. One mode of operation comprises receiving only AM broadcast band signals, while the CB transmitter 12 and CB receiver 13 remain inoperative. Another mode of operation selectable by the mode circuit 20 is that only CB signals will be received and transmitted by the multi-channel communication device 10 and the AM receiver 11 will be inoperative. Still a third mode selectable by the circuit 20 is that AM signals may be received, but received or transmitted CB signals will have priority over the received AM signals.

FIG. 1 illustrates one typical embodiment of the mode selector circuit 20. In this typical embodiment the mode selector includes a two position CB-AM switch 19a that has terminal 19 connected to a wiper arm, also designated 19a, of this switch. Typically, switches, and their wiper (actuator) arms will be designated by identical reference numbers. In an AM position of the switch 19a, terminal 19 is directly connected to a terminal 21 which is directly connected to a terminal 11a that supplies operative power to the AM receiver 11. With the CB-AM switch 19a in a CB position, the terminal 19 is directly connected to terminals 22 and 23. The terminal 22 is directly connected to a terminal 24 of a squelch gate signal select circuit 25. The operation of the circuit 25 will be fully explained subsequently.

The terminal 23 is directly connected to a transmit-receive switch 26 which is shown dashed as consisting of a two position selector switch having a wiper arm 26a. With the arm 26a in one position, terminal 23 is directly connected through a terminal R to a terminal 27 which supplies operative power to the CB receiver 13. With the wiper arm 26a in its other operative position, the terminal 23 is directly connected through a terminal T to a terminal 28 which supplies operative power to the CB transmitter 12. Thus switch 26 performs the function of selecting a transmit or receive mode for the CB apparatus 12 and 13 of the multi-channel communication device 10.

The mode selector circuit 20 also includes a two position monitor switch 18a that has a wiper arm 18a directly connected to the terminal 18. In one of the operative positions of the monitor switch 18a, the terminal 18 will be directly connected to the terminal 23. In the other one of the operative positions of the monitor switch, the terminal 18 will be connected to an isolated terminal.

Thus the mode selector circuit 20 and the transmit-receiver switch 26 selectively supply power to the AM receiver 11, the CB transmitter 12, and the CB receiver 13. In one mode of operation, power is only supplied to the AM receiver 11. In another mode of operation, power is only supplied to either the CB transmitter or the CB receiver. In still another mode of operation, power is supplied to the AM receiver 11 and either the CB transmitter 12 or the CB receiver 13. Thus the circuit 20 and the switch 26 effectively determine which of the basic communication blocks 11 through 13 will be operable when the on-off switch 16 is in its on position.

The tuning circuit 14 is coupled to both the CB receiver 13 and the CB transmitter 12. The tuning circuit essentially supplies signals to the CB receiver and transmitter which step tune these circuits, in discrete frequency steps, to any one of a predetermined plurality of discrete channel frequencies.

The squelch gate and signal select circuit 25 is coupled to the AM receiver 11 and receives detected audio signals from this receiver at an AM audio input terminal 30. The circuit 25 receives detected CB audio signals from the CB receiver 13 at a CB audio input terminal 31. A rapid squelch control voltage is received from the CB receiver at a terminal 32, and a squelch delay signal is received from the receiver 13 at a terminal 33. Audio signal selection is provided by the circuit 25, and the selected audio signals are coupled to an audio output terminal 34 which is coupled through an audio amplifier 35 to a speaker 36. Basically, the squelch gate and signal select circuit 25 can receive audio input signals from either the AM receiver 11 or the CB receiver 13, and control signals received at the terminals 24, 32, and 33 determine which, if any, of these audio signals will be coupled to the audio output terminal 34.

The AM receiver 11 receives AM RF (radio frequency) input signals on an AM antenna 31. These signals are coupled to an RF amplifier stage 32 which supplies amplified signals to a tunable mixer and IF stage 33 that is coupled to a detector circuit 34 which supplies the detected audio from the received AM signals to the audio input terminal 30 of the squelch gate signal select circuit 25. The AM receiver 11 comprises the RF amplifier 32, the tunable mixer and IF stage 33 and the detector 34. The tuning of the AM receiver is contemplated as being accomplished by any standard AM tuning mechanism which can continuously tune the AM receiver across the entire AM broadcast band. Thus the AM receiver 11 generally corresponds to the types of AM radio receivers typically found in automobiles and the components 32–34 are well known to those of average skill in the art.

The CB transmitter 12 includes a microphone 35 coupled through an audio amplifier 36 to a modulator circuit 37. The modulator circuit is coupled to the tuning circuit 14 which supplies a carrier frequency signal for the CB transmitter. The output of the modulator is coupled through an RF amplifier 38 to a transmit-receive switch 40. The components 35 through 38 generally comprise the CB transmitter 12 whose basic function is to provide transmit signals to the switch 40 at a channel frequency, determined by the carrier frequency signal received from the tuning circuit 14, when power is applied to the operative power terminal 28. The operation and construction of the components which comprise the transmitter 12 is well known to those of average skill in the art.

The transmit-receive switch 40 is illustrated as a two position mechanical switch having an actuator (wiper arm) 40a which is mechanically ganged to the actuator 26a of the transmit-receive switch 26. The wiper arm 40a is directly connected to a CB antenna 41. When the switch 26 supplies operative power to the receiver 13, the switch 40 connects the antenna 41 to the receiver. When the switch 26 supplies operative power to the transmitter 12, the switch 40 couples the receiver 41 to the transmitter. Thus the switches 26 and 40 merely insure that the antenna 41 will be connected to the transmitter or receiver whenever either of these is operative.

The CB receiver 13 includes an RF amplifier 42 for receiving RF input signals from the antenna 41 through the switch 40. A first mixer stage 43 is coupled to the amplifier 42 and receives amplified RF signals therefrom. The first mixer 43 also receives a first mixing frequency signal from the tuning circuit 14. The first mixer combines these two inputs and produces a first IF signal (10.695 MHz) which is coupled through a first IF filter 44 to a second mixer 45. This second mixer is also coupled to the tuning circuit 14 and receives a second mixing frequency signal from the tuning circuit. The mixer 45 combines this second mixing frequency signal with the first IF signal and produces a second IF signal (455 kHz) which is coupled to a second IF filter 46. An IF amplifier 47 is coupled to the filter 46 and receives the second IF signal, amplifies it, and supplies this amplified signal to a detector 48. The detector demodulates the second IF signal and produces detected audio signals which are coupled to the CB audio input terminal 31.

The IF amplifier 47 also produces a DC AGC signal at a terminal 49. The magnitude of this AGC signal is related to the strength of the RF input signal received by the amplifier 42 from the antenna 41. The AGC terminal 49 is coupled back to the RF amplifier 42 to control the gain of this amplifier by signal feed back. The components 42 through 48 comprise a standard double conversion superhetrodyne receiver and each of these components is well known to those of average skill in the art. The feeding back of an AGC voltage to control the gain of an RF amplifier is also well known. In one practical embodiment of the present invention a single integrated circuit (RCA circuit CA3088) was used for the first mixer 43, the second mixer 45, the IF amplifier 47 which develops an AGC voltage, and the detector 48.

The AGC terminal 49 is also coupled to a squelch trigger circuit 50 which receives the AGC signal and produces a high or low logic squelch signal at an output terminal 51 in response to the magnitude of the AGC signal at the terminal 49 being above or below a predetermined squelch threshold voltage. The terminal 51 is directly coupled to the control terminal 32 of the squelch gate signal select circuit 25. The signal at the terminal 51 rapidly responds whenever the AGC signal changes its magnitude with respect to the predetermined squelch voltage, therefore this signal will be referred to as a rapid squelch signal.

The terminal 51 is coupled to a squelch delay circuit 52 which receives this rapid squelch signal and produces an output signal at a terminal 53 that is coupled to the tuning circuit 14 and the terminal 33 of the squelch gate signal select circuit 25. The signal at the terminal 53 responds rapidly to signal changes at the terminal 51 which are of one polarity, but produces a delayed response to signal changes at the terminal 51 which are of the opposite polarity. Thus the signal present at the terminal 53 will be referred to as a delayed squelch signal.

The components 42 through 52 generally comprise the CB receiver 13 and the operation of the receiver is as follows. When operating voltage is supplied to the receiver 13 at the terminal 27, the RF amplifier will receive signals from the antenna 41. These signals are amplified and fed to the first mixer 43 which also receives one of a predetermined plurality of discrete channel signals from the tuning circuit 14. The received channel signal and the received input signal are mixed together by the circuit 43 and a first IF signal having a frequency of 10.695 MHz (megahertz) is obtained by high-side conversion. The first IF signal is received by the second mixer 45 and mixed with a 10.24 MHz signal supplied by the tuning circuit 14. This creates a second IF signal having a frequency of 455 kHz (kilohertz) which is supplied to the IF amplifier 47.

The amplifier 47 creates an AGC signal related to the strength of the received RF signal which created the first IF signal. When the AGC signal at the terminal 49 exceeds a predetermined squelch threshold, a high logic signal will be created at the terminal 51, and also at terminal 53, which results in the squelch gate and signal select circuit 25 passing the CB audio signals at terminal 31 to the audio output terminal 34 while preventing any AM audio signals at the terminal 30 from reaching terminal 34. When the AGC signal at the terminal 49 falls below this predetermined threshold a low logic signal is produced at the terminal 51. This low logic signal prevents the passage of CB audio signals from the terminal 31 to the terminal 34. The high logic signal at the terminal 53 is delayed, for a predetermined time, before it terminates. This prevents any passage of AM signals from the AM input terminal 30 to the output terminal 34 for this predetermined time. After this predetermined time has expired with no CB signals being subsequently received by the receiver 13, the squelch gate signal select circuit 25 will then pass audio signals at the AM terminal 30 to the audio output terminal 34, provided that a high voltage is not supplied to the terminal 24 by the mode selector circuit 20 which would indicate that AM signals are not desired. The detailed operation of the squelch gate and signal select circuit 25 will be subsequently described in connection with FIG. 3 which illustrates a typical embodiment for such a circuit.

The tuning circuit 14 includes a manual electronic channel selection switch 55 which is illustrated as a three position mechanical switch having a single actuator (wiper arm) 55a. The manual switch 55 has a wiper arm contact terminal 56 directly coupled to ground, a middle (at rest) terminal 57 not connected to any circuitry, and an up scan terminal 58 and a down scan terminal 59 each coupled to a control circuit 60. Without manual pressure being applied to the actuator 55a, the actuator will normally be mechanically spring biased such that the terminals 56 and 57 are electrically connected together. When manual pressure is applied to the actuator in one direction, the actuator will move into a first position such that terminal 58 will be directly coupled to ground through the actuator 55a. Upon release of the manual pressure, the actuator will again revert to its at rest position with terminal 57 being connected to ground. When manual pressure is applied in an opposite direction, the actuator will be moved into a second position such that the terminal 59 will be directly connected to ground. Upon release of this manual pressure, the actuator will again revert to its at rest position.

Another manual channel selection switch 55' is illustrated in phantom as being coupled to switch 55. Switch 55' represents a switch identical to switch 55 which is remotely located from switch 55 and which has its components directly electrically connected to the corresponding components of switch 55. Thus movement of either actuator 55a or actuator 55a' can connect terminals 58 or 59 to ground.

Figure 6:
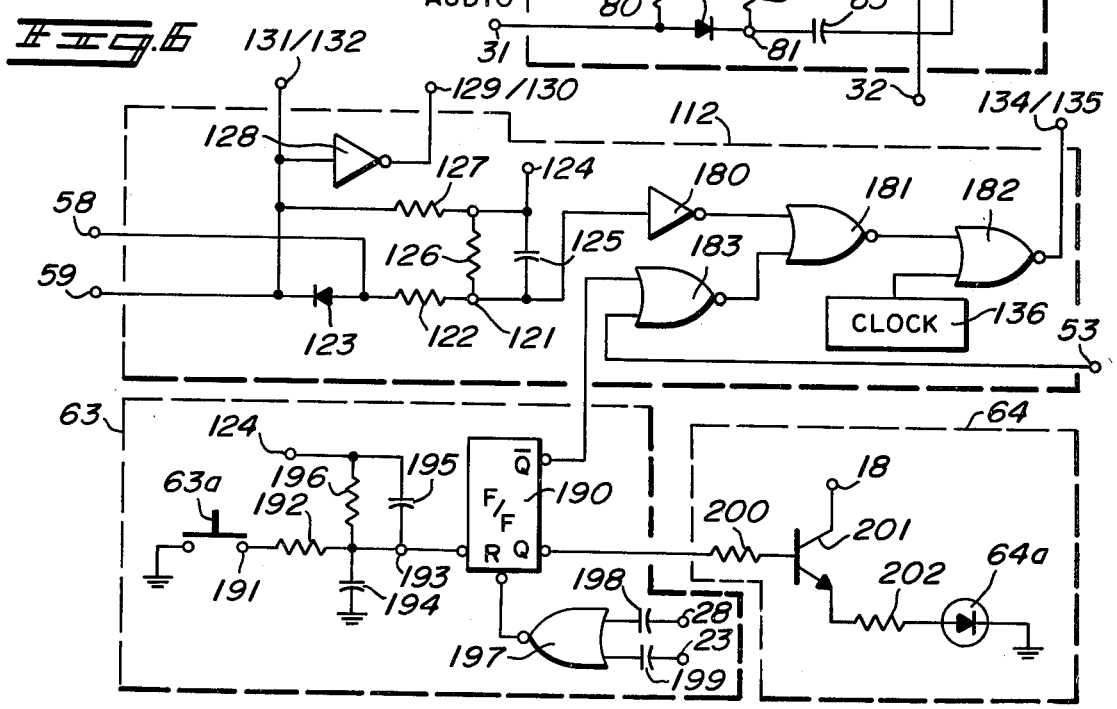
FIG. 6 is a schematic and block diagram illustrating an alternate circuit design for portions of the communication device illustrated in FIGS. 5 and 1.

The control circuit 60 responds to the movement of the manual select switch 55 by creating an up control signal with the actuator 55a in its first position, a down control signal with the actuator 55a in its second position, and an enable control signal with the actuator 55 in either of the first and second positions. The control circuit 60 will terminate the enable signal whenever the actuator 55a reverts back to its at rest (third) position (contacting terminal 57). The control circuit 60, which will subsequently be described in detail in connection with the discussion of FIGS. 5, 6, and 7, is coupled to a frequency synthesizer 61 and responds to the production of the up, down and enable control signals and provides a plurality of control signals to the synthesizer 61 which supplies the first and second mixing frequency signals to the receiver 13 and supplies the transmitter carrier frequency signal to the transmitter 12.

The control signals supplied by the control circuit 60 to the frequency synthesizer 61 determine the frequency of the signals supplied by the synthesizer to the CB transmitter 12 and the CB receiver 13. The signals supplied by the synthesizer result in tuning, in discrete steps, either the transmitter 12 or the receiver 13 to any one of a predetermined plurality of discrete channels at which the transmitter or receiver will operate at. The frequency synthesizer 61 accomplishes this by generating, selectively in response to the control signals produced by the control circuit 60, any one of a predetermined plurality of discrete channel signals, each of these channel signals having a different frequency. Thus the control circuit 60 controls the frequency of the channel signals supplied by the synthesizer 61 to the transmitter 12 and the receiver 13, and the frequency of these channel signals determines the channel to which the transmitter and receiver will be tuned to.

In response to the existence of the enable signal along with either the up or down control signal, the control circuit 60 will continuously step in discrete steps the frequency synthesizer 61 through each of a predetermined plurality of discrete channel signals in either a first or second predetermined sequence. The selection of which of the two predetermined sequences will be implemented is determined by whether the up or down control signal exists. The continuous sequential stepping can be initiated by movement of the actuator 55a into its first (up scan) or second (down scan) positions and it will continue until the enable signal has been terminated by the actuator 55a reverting to its at rest position.

A visual digital channel display 62 is coupled to the control circuit 60 and provides a visual numeric indication of the channels selected for the transmitter and receiver by the control circuit 60 and frequency synthesizer 61. The channel select switch 55 has been designated a "manual" channel select switch since the termination of the sequential channel selection process is primarily controlled by the mechanical position of an actuator which is manually moved by the operator of the communication device 10. Thus a "manual" channel select switch can select any of the predetermined plurality of channels at which the receiver and transmitter can operate at in response to manual control of a switch actuator. By way of contrast, "automatic" channel selection or channel scan circuits are understood to refer to those circuits in which any one of a predetermined plurality of discrete channel signals cannot be selected merely in response to the mechanical positions of an actuator which is manually controllable.

The tuning circuit 14 includes an automatic scan circuit 63 which is coupled to the control circuit 60. The automatic scan circuit essentially continually supplies the control circuit 60 with the enable signal and one of the up and down control signals. However, when the automatic scan circuit 62 is activated, the enable signal it supplies to the control circuit 60 will be terminated by the creation of a high logic signal at the terminal 53, which is directly coupled to the control circuit 60. Thus in the automatic scan mode, the tuning circuit 14 will continuously step, in discrete steps, the transmitter 12 and receiver 13 through all of the predetermined operable channels for these circuits until either the automatic scan circuit is deactivated or a signal is received on the citizen band channel to which the receiver 13 is tuned, this received signal creating a high logic signal at terminal 53. When the received citizen band signal has terminated, the squelch delay circuit 52 holds the voltage of the terminal 53 at its previous high level for a predetermined time, so that automatic scanning will not instantly resume upon the termination of a received citizen band signal. Thus an automatic scan capability has been provided for the citizen band receiver which searches through each of the allowable citizen band channels for a transmitted signal. Once a signal is found on a channel, the communication device then locks onto this channel and monitors it until the signal is terminated. If additional signals are not received on this channel within a predetermined time after the termination of the last received signal, then the automatic scanning is reinstituted.

An automatic scan indicator 64 is illustrated as being connected in phantom to the automatic scan circuit 62. This automatic scan indicator represents a visual indicator that signals the operator of the communication device 10 as to the operative state of the automatic scan circuit 63. In many cases it may be necessary to produce a visual indication of the operative nature of the scan circuit 63 so that the operator of the communication device 10 will know if the channel to which he is listening on his CB receiver is being tuned in by the manual select circuit 55 or the automatic scan circuit 63. If the station is tuned in by the automatic scan circuit 63, the CB apparatus will be automatically retuned after an appreciable pause occurs after the termination of a received signal. This automatic retuning may not be desired by the operator of the communication device.

It should be emphasized that the tuning control circuit 14 provides for operation of the citizen band receiver and transmitter only on a predetermined plurality of discrete channel frequencies. This is not the sort of tuning which is used for the standard AM and FM receivers. The standard receivers can be continuously tuned to any frequency throughout a predetermined band. When transmitters are part of the communication equipment, federal regulations require that transmissions take place only on discrete frequency channels. Some federal regulations even prohibit receiving signals on certain frequency channels. Thus it is imperative that the citizen band receiver and transmitter be only tunable to a predetermined plurality of channels, and that the transmitter must only be tunable to a predetermined plurality of discrete channel frequencies. The tuning circuit 14 provides for tuning in discrete steps to any of a predetermined plurality of channels, and therefore is not at all similar to the continuous tuning function provided by infinitely variable capacitors or inductors used in standard AM and FM radios. The circuit 14 is therefore also not similar to automatic frequency sweeping circuits which continually vary the tuning of AM or FM receivers over all frequencies in a predetermined frequency band.

The operation of the mode selector circuit 20 will now be discussed with particular emphasis upon the different modes of operation which are available for the multi-channel communication device 10 and how these modes of operation are influenced by the manual channel select switch 55 and the automatic scan circuit 63.

As previously mentioned, the mode selector circuit 20 includes two independent two position manual switches, a CB-AM switch 19a having its wiper arm connected to the terminal 19 and a monitor switch 18a having its wiper arm connected to the terminal 18. With the on-off switch 16 in its on position, a regulated positive DC voltage is applied to both terminals 18 and 19 by the regulator 17. With the CB-AM switch 18a in its AM position, the terminals 19 and 21 are directly connected together. In this position, a regulated voltage is supplied to the power supply terminal 11a of the AM receiver 11 and the receiver is thereby rendered operable. With the wiper arm of the CB-AM switch in its CB position, the terminal 19 is directly connected to the terminals 22 and 23 and no voltage is supplied to the power terminal 11a of the AM receiver. Thus the AM receiver 11 is not operable in this condition but power is supplied, through the transmit-receive switch 26, to either the CB transmitter 12 or the CB receiver 13. In addition, a relatively high DC voltage is supplied to the terminal 24 of the squelch gate signal select circuit 25 and this voltage prevents any audio signals which may occur at the terminal 30 from reaching the audio output terminal 34.

The monitor switch 18a of the mode selector circuit 20 either connects the terminal 18 to an open circuit terminal in one position or to the terminal 23 in a second position. With the CB-AM switch 19a in its AM position and the monitor switch 18a in its position where the terminal 18 is connected to the terminal 23, power is supplied to the AM receiver and in addition, power is supplied to either the CB transmitter 12 or the CB receiver 13. In addition, a high voltage is not applied to the terminal 24 and therefore the squelch gate and signal select circuit 25 may now select the audio signals present at either terminal 30 or 31 in accordance with the control signals received at the terminals 32 and 33. This will be referred to as the monitor mode of the multi-channel communication device 10. In this monitor mode, AM audio signals are considered nonpriority audio signals and are coupled to the audio output terminal 34 only when the CB receiver 13 does not detect any received CB signals. An additional connection (not shown in FIG. 1) exists which prevents the squelch gate signal select circuit 25 from selecting any audio signals to be coupled to the output terminal 34 during the actuation of the CB transmitter 12.

In the monitor mode, when the receiver 13 receives a signal on the channel frequency to which it is tuned, an AGC signal is produced at the terminal 49. If this AGC signal is above a predetermined squelch threshold, a logic signal is produced at the terminal 51 which is coupled to the control terminal 32 and results in disconnecting the terminal 30 from the audio output terminal 34 and connecting the terminal 31 to this output terminal. Upon termination of the received CB signal, a logic signal is maintained at the terminal 33 by the squelch delay circuit 52 while the control signal at the terminal 32 is rapidly terminated. This results in disconnecting the terminal 31 from the terminal 34, but delaying, due to circuit 52, the reconnection of the AM audio terminal 30 to the output terminal 34 for a predetermined period of time, typically about 4 seconds. This delay period is provided so that the communication device 10 can monitor sequential transmissions on a CB channel which have pauses between them of up to four seconds without producing AM audio signals between these transmissions. A quick reversion to receiving the nonpriority AM signals would be undesirable in such instances.

When the automatic scan circuit 63 is actuated, the control circuit 60 causes the frequency synthesizer 61 to sequentially tune the CB receiver 13 to each of a plurality of predetermined channels in discrete steps. Thus in the monitor mode with the automatic scan circuit 63 operative, the multi-channel communication device 10 will monitor a nonpriority AM channel while continually searching all of the plurality of CB channels for priority CB signals. When a CB signal is received by the receiver 13, a high logic signal is produced at the terminal 53 which results in inhibiting further tuning of the CB receiver until four seconds after the termination of the last received CB signal on the channel to which the receiver 13 is tuned. If the automatic scan circuit 63 is not operable, the manual select switch 55 will control the tuning of the CB receiver and transmitter and sequential tuning will not be inhibited by the creation of a high logic signal at the terminal 53, but otherwise the response of the communication device 10 will be the same.

While some prior art systems have monitored a single priority channel, none of them provide the function of monitoring a plurality of priority channels while producing an interruptable audio signal in response to a nonpriority channel if priority signal receptions do not occur. Thus the present invention is ideally suited for a combination CB and AM radio which is intended for use in an automobile. In the automobile environment, typically the operator of a communication device is interested in monitoring any signal transmissions which occur on any CB channel, but in the absence of any CB transmission he would prefer to listen to his favorite entertainment station.

Figure 2:
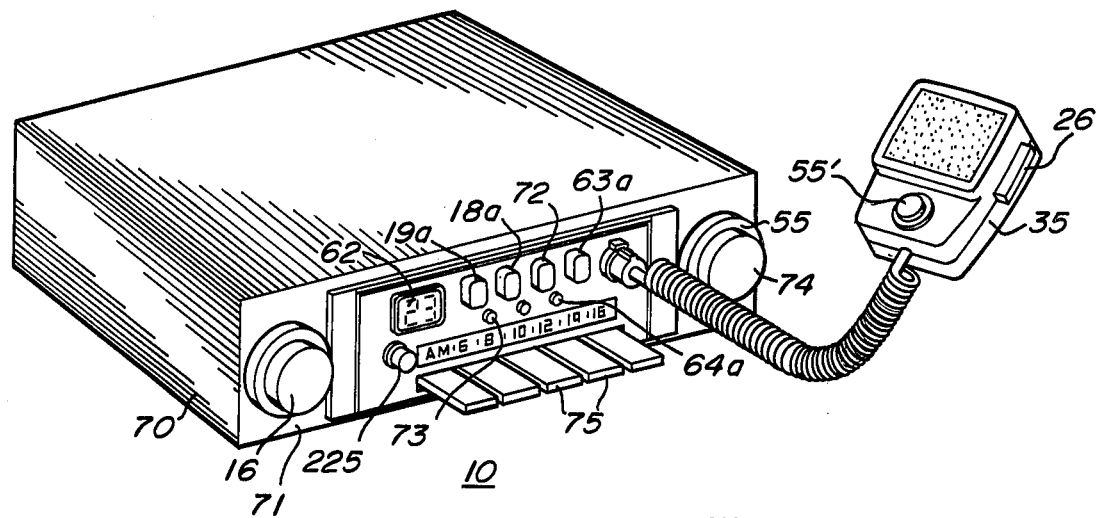
FIG. 2 is a perspective view of a housing with manual controls for the multi-channel communication device illustrated in FIG. 1.

FIG. 2 illustrates a perspective view of the exterior of the multi-channel communication device 10. Identical reference numbers are used to designate corresponding apparatus illustrated in FIG. 1, and this type of notation will be used in all of the drawings.

FIG. 2 illustrates that the communication device 10 has a housing 70 which generally houses the AM receiver 11, the CB transmitter 12, and the CB receiver 13. The on-off switch 16 is illustrated as a rotary switch mounted on an inner control shaft which protrudes from the left hand side of a front control panel face 71 of the housing 70. The digital display 62 is illustrated as an LED display in FIG. 2. The CB-AM switch 19a is illustrated as a two position push button. The monitor switch 18a is also illustrated as a two position push button. A memory push button 72 is also present on the front control face 71 and the function of this button will be described more fully subsequently. A push button 63a is also illustrated and represents the actuator of a switch 63a which renders the automatic scan circuit 63 operable. A light 64a represents an embodiment of the automatic scan indicator 64, and a light 73 indicates when the CB transmitter 12 has power applied to it. A rotary control 74 is mounted on an inner right hand shaft that protrudes through the front control face 71. The control 74 is used as an infinitely variable manual tuner for the AM receiver 11. The AM receiver is also illustrated as being tunable by a plurality of push buttons 75. The manual CB channel select switch 55 is illustrated as a three position rotary switch 55 mounted on an outer right hand shaft that surrounds the inner right hand shaft to which the AM tuning control 74 is mounted.

The microphone 35 is illustrated in FIG. 2 as being remotely located from the housing 70 and this microphone contains the transmit-receive switch 26 illustrated as a two position push-to-talk switch. The switch 55' is illustrated as a three position rotary switch mounted to the microphone 35. Thus the operator of the multi-channel communication device 10 can manually select the tuning of discrete CB channel frequencies either by adjustment of the three position rotary switch 55 which is mounted to the housing 70 or by adjustment of the three position rotary switch 55' which is mounted to the microphone 35. In the operation of communication devices which are mounted in automobiles, often only one hand is available for actuation of control knobs. When the operator of the communication device 10 wishes to transmit signals, he may often wish to sequentially transmit signals on a number of different CB channels. The present invention provides a convenient way for the operator of the communication device 10 to implement such a function since he can grasp the microphone in one hand, readily tune to a desired CB channel with the thumb of that hand and then actuate the transmitter to transmit on that tuned channel by depressing the push button 26 also with the thumb of that hand. When the communication device 10 is installed in automobiles, this feature will enable the operator of the communication device to readily tune to a clear CB channel and transmit a signal thereon without unduly distracting the operator from his primary job of driving the vehicle.

Figure 3:
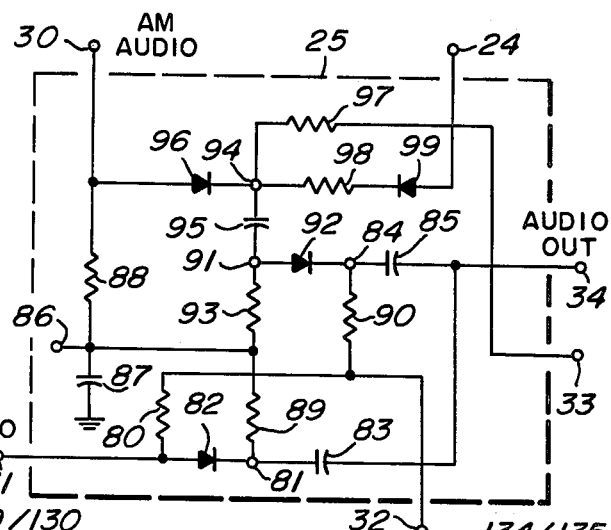
FIG. 3 is a schematic diagram illustrating a typical construction of one of the component blocks shown in FIG. 1.

Referring now to FIG. 3, a typical embodiment of the squelch gate signal select circuit 25 is illustrated with identical reference numbers designating components and terminals identical to those illustrated in the rest of the drawings.

The CB audio terminal 31 is directly connected to the control terminal 32 through a resistor 80 and is connected to an internal terminal 81 through a diode 82 having its cathode connected to the terminal 81. The audio output terminal 34 is coupled to the terminal 81 through a capacitor 83 and is coupled to an internal terminal 84 through a capacitor 85. A voltage reference terminal 86 is illustrated inside the circuit 25 and is coupled to ground by a capacitor 87, to the AM audio terminal 30 through a resistor 88 and to the terminal 81 through a resistor 89. The terminal 84 is coupled to the terminal 32 through a resistor 90 and is coupled to an internal terminal 91 through a diode 92 having its cathode connected to the terminal 84. The terminal 91 is connected to the terminal 86 through a resistor 93 and is coupled to a terminal 94 through a capacitor 95. The terminal 94 is coupled to the terminal 30 through a diode 96 with its anode connected to the terminal 30. The terminal 94 is also coupled to the terminal 33 through a resistor 97 and is coupled to the terminal 24 through a resistor 98 connected in series with a diode 99 having its anode coupled to the terminal 24. The components 80 through 99 generally comprise a typical embodiment of the squelch gate signal select circuit 25.

The operation of the circuit 25 will now be discussed. A fixed positive reference voltage having a moderate value is constantly applied to the terminal 86. When only CB operation is to be allowed, a high voltage is present at the terminal 24 and this reverse biases the diode 96 and prevents the passage of audio signals from the terminal 30 through the capacitors 95 and 85 to the audio output terminal 34. When power is to be supplied to the AM receiver 11, a high voltage is not present at the terminal 34. This allows the diode 96 to be forward biased if a high voltage is not applied to the control terminal 33. High voltages are applied to the control terminal 33 only when the CB receiver 13 is operative and CB signals are currently being received or have been received within the last four seconds. When CB signals are not being received, a low voltage is present at the terminal 32. This voltage will reverse bias the diode 82 and forward bias the diode 92. The net effect of this is the passage of audio AM signals from the terminal 30 to the output terminal 34 in the absence of recently received CB signals when the device 10 is in the monitor mode.

When CB signals are detected by the receiver 13, a high squelch control voltage is produced at the terminals 32 and 33. The voltage at terminal 32 reverse biases the diode 92 and forward biases the diode 82 resulting in the passage of CB audio signals from the terminal 31 to the output terminal 34 while blocking the passage of AM audio signals to terminal 34. Upon the termination of a received CB signal, a low voltage is instantly produced at the control terminal 32. This results in reverse biasing the diode 82 and blocking the transmission of CB audio signals to the audio output terminal 34. However, a high voltage will remain present on the terminal 33 until four seconds after the termination of the CB signal. Thus the AM audio terminal 30 is not reconnected to the audio output terminal 34 until four seconds after the termination of CB signals which are detected by the receiver 13. This provides for four seconds of receiver quieting so that intermittent CB signals may be monitored by the communication device 10 without garbling the produced audio by connecting AM audio signals between the received CB signals. This will remain true as long as less than a four second duration exists between the sequential reception of CB signals by the receiver 13. Typically less than four seconds elapse between CB two-way transmissions. Essentially, the control terminal 32 and the diode 82 form a typical squelch gate for the received CB signals, whereas the rest of the circuitry implements the complex switching functions which must be available for all of the previously discussed modes of operation of the multi-channel communication device 10.

FIG. 4 illustrates a typical embodiment of the frequency synthesizer 61 contained in the tuning circuit 14. Identical reference numbers are used to designate identical corresponding parts. The synthesizer 61 basically comprises a programmable phase lock loop having a crystal reference oscillator 100. The crystal oscillator is directly coupled to the second mixer 45 and supplies the second mixing signal to the CB receiver 13. The oscillator also supplies a reference frequency signal to a fixed divider circuit 101 which supplies a frequency divided signal to a phase detector 102. The phase detector also receives an input from a programmable frequency divider 102 whose frequency division is controlled by a plurality of connections 60a from the control circuit 60 and a connection to the transmit supply terminal 28. The phase detector 102 compares the signals it receives from the fixed divider 101 and programmable frequency divider 103 and produces a different signal that is coupled to a voltage controlled oscillator (VCO) 104 through a low pass filter 105. The output of the voltage controlled oscillator is coupled to a different mixer 106, to an additive frequency transmitter mixer 107, and to the first mixer 43 of the CB receiver 13. The difference mixer mixes the output of the VCO with an input signal supplied by a fixed multiplier-divider circuit 108 that receives an input signal from the crystal oscillator 100 and produces an output signal having a frequency with a fixed relationship to the crystal oscillator frequency. The output of the difference mixer is coupled as an input to the programmable frequency divider 103. The crystal reference oscillator 100 also supplies an input mixing signal to the transmitter mixer 107.

Basically, the frequency synthesizer 61 has a phase lock loop consisting of the VCO 104, the low pass filter 105, the phase detector 102, the programmable divider 103, and the difference mixer 106. A reference signal is fed into the phase detector 102 from the crystal oscillator 100 and the fixed divider 101. The reason for using the difference mixer 106 is to mix down the output signal of the VCO such that a low frequency input signal will be provided to the programmable frequency divider 103. This makes it easier for the programmable frequency divider to handle the input signal and this enables the frequency synthesizer to accurately control the frequency of the signals it supplies to the CB receiver and transmitter.

The output signal of the crystal oscillator 100 is contemplated as having a frequency of 10.24 MHz so that it will mix with the first IF signal (10.695 MHz) and directly produce the second IF signal of 455 kHz. The fixed divider 101 is used to divide down the frequency of the crystal oscillator signal that is supplied to the phase detector 102 for comparison. In the preferred embodiment of the invention, the signals received by the phase detector 102 from the fixed divider 101 and the programmable divider 103 will have a frequency of 5 kHz.

Control signals from the control circuit 60 are applied to the programmable divider 103 on lines 60a and control the frequency division implemented by this divider. This in turn controls the frequency generated by the VCO 104, since the phase lock loop circuitry will tend to change the frequency of the VCO until a 5 kHz signal is produced by the programmable divider 103. The multiplier-divider 108 provides a fixed combination of frequency multiplication and division such that an appropriate difference frequency signal is provided to the programmable frequency divider 103 by the difference mixer 106. The general principles of phase lock loops are well known to those of average skill in the art and therefore the details of the construction of the individual elements shown in block form in FIG. 4 will not be gone into.

When the CB transmitter is operative, a positive logic signal is supplied to the programmable frequency divider by the power supply terminal 28 of the transmitter 12. This provides for changing the divide ratio of the programmable divider 103 from an even divide number to an odd divide number, and this change is necessary because of the particular frequencies involved. In addition, different control signals are supplied to the programmable frequency divider during actuation of the transmitter 12, since a signal having a different frequency is required of the VCO 104 during transmission. This signal produced by the VCO is coupled to the transmitter mixer 107 and mixed with the output signal supplied by the crystal oscillator 100. The resultant signal is then supplied to the modulator 37 of the CB transmitter 12.

The basic function of the frequency synthesizer 61 is to respond to the control signals produced by the control circuit 60, and to the selection of a transmit or receive mode of operation for the CB apparatus, and to produce any one of a predetermined plurality of discrete channel signals which will be coupled to the CB transmitter 12 or the CB receiver 13. The channel signal produced results in tuning each of these circuits to one of a predetermined plurality of operative channel frequencies. The frequency synthesizer responds to the control signals produced by the control circuit 60 and produces a discrete channel output signal in response to each different combination of control signals received on lines 60a. When the control circuit 60 produces a sequence of different control signals, the frequency synthesizer 61 produces a plurality of discrete channel output signals in which each output signal differs from the previous one by a discrete predetermined frequency difference. Thus the frequency synthesizer provides apparatus which can sequentially step the the tuning of the CB receiver 13 the and transmitter 12 through a plurality of discrete channels in predetermined frequency steps.

The operation of the control circuit 60 and its interreaction with the manual channel select switch 55 and the automatic scan circuit 63 will now be discussed, first in general and subsequently in detail.

Referring now to FIG. 5, typical embodiments of the control circuit 60, the digital display 62 and the automatic scan circuit 63 are illustrated with identical reference numbers used for identical corresponding components illustrated in other Figures. Basically, the control circuit 60 receives signal inputs from a number of different sources and produces output signals to both the digital channel display 62 and the frequency synthesizer 61. The output signals coupled to the synthesizer 61 are supplied on the plurality of connections 60a and the output signals supplied to the digital display 62 independently control two independent LED numerical displays 110 and 111 which comprise the display 62. Input signals are received from the terminals 58 and 59 of the manual select switch 55, the output terminal 53 of the squelch delay circuit 52, the automatic scan circuit 63, and the transmit terminal 28 which has a high voltage when the CB transmitter 12 is operable. These input signals control the output signals supplied by the control circuit 60 and allow the circuit to perform all of its previously recited functions.

Control signal inputs from the manual select switch 55, the control terminal 53, and the automatic scan circuit 63 are initially received by a signal processing circuit 112 in the control circuit 60 which processes these signals and supplies control signals to first and second up/down counters 113 and 114. These counters supply logic count (control) signals along a plurality of connections to a read only memory circuit 115 and to two identical digit drivers 116 and 117 which are coupled to and drive the digit displays 110 and 111, respectively. The control circuit 60 also includes an illegal channel detector circuit 119 which prevents the counters 113 and 114 from supplying the read only memory with incorrect control signals, and a zero channel detector circuit 118 which monitors all of the control signals supplied by the counters 113 and 114 and prevents these control signals from all being zero simultaneously. Essentially, the circuit 112 controls the operation of the counters 113 and 114 which will supply sequential control signals, during tuning, to the read only memory circuit 115 and digit drivers 116 and 117. The read only memory circuit 115 processes the counter output signals it receives and produces the synthesizer control signals on the plurality of connections 60a. The components 112 through 119 generally comprise the heart of the control circuit 60.

The signal processing circuit 112 includes a diode 120 having its cathode connected to the terminal 58 and its anode connected to a terminal 121 through a resistor 122. A diode 123 has its cathode connected to the terminal 59 and its anode directly connected to the anode of the diode 120. The terminal 121 is coupled to a positive voltage supply terminal 124 through a capacitor 125 connected in parallel with a resistor 126. A resistor 127 is coupled between the power supply terminal 124 and the terminal 59, and the terminal 59 is coupled through an inverter circuit 128 to preset terminals 129 and 130 of the counters 113 and 114, respectively. The terminal 59 is directly coupled to up/down control terminals 131 and 132 of the counters 113 and 114, respectively. The terminal 123 is directly coupled as an input to a NOR logic gate 133 which has its output coupled to clock pulse receiving terminals 134 and 135 of the counters 113 and 114, respectively. A reference clock 136 supplies clock pulses as inputs to a NOR logic gate 137 that has its output coupled as an input to the NOR logic gate 133. The terminal 53 is directly connected as another input to the logic gate 137 and this input is also coupled to the automatic scan circuit 63. The components 120-128, 133, and 136 and 137 comprise the circuit 112.

When a high logic signal is not present at the terminal 53, the NOR gate 137 receives clock pulses from the reference clock 136 and passes these pulses on to the NOR gate 133. These clock pulses will be passed on to the counters 113 and 114 by gate 133 only if a low logic state (low voltage) is present at the terminal 121. Therefore a low signal at the terminal 121 is designated as an "enable" signal, since this signal will allow clock pulses to be received by the counters 113 and 114.

When ground potential is connected to either of the terminals 58 or 59, one of the diodes 120 and 123 will become forward biased and the potential at the terminal 121 will fall to a value determined by the magnitudes of the resistors 126 and 122 and also the magnitude of the positive voltage present at the supply terminal 124. The resistor 122 has a typical magnitude of 150 ohms, whereas the resistors 126 and 127 are typically 100 K(kilo) ohms. Thus when ground potential is supplied to terminals 58 or 59, a low potential, almost at ground potential, will be produced at the terminal 121 and this potential will allow clock pulses to pass through the gate 133 to the counters 113 and 114. If ground potential is subsequently removed from both of the terminals 58 and 59, the voltage at the terminal 121 will slowly rise up to the value of the potential at the supply terminal 124. This is due to the discharging of the capacitor 125 by current through the resistor 126. Thus an enable signal is produced at the terminal 121 with ground potential applied to either of the terminals 58 or 59 by the manual channel select switch 55 (or the switch 55').

With ground potential applied to the terminal 58 by the switch 55, a positive (up) control signal is supplied to the terminals 131 and 132 of the counters 113 and 114. This is because of the presence of the resistor 127 and the isolation provided by the diode 123. With ground potential applied to the terminal 59 by the switch 55, a low (down) control signal is supplied to the terminals 131 and 132. Thus the mechanical position of the actuator-wiper arm 55a of the manual select switch 55 not only creates an enable signal when it supplies ground potential to terminals 58 or 59, but also creates up or down control signals that indicate to the counters 113 and 114 which one of the terminals 58 or 59 has ground potential applied to it by the switch 55. With ground applied to terminal 58, for example, clock pulses will be passed through the NOR gate 133 and a positive signal will be received at the terminals 131 and 132. This enables the counters 113 and 114 to receive clock pulses and count these clock pulses in an upward sequential direction.

The automatic scan circuit 63 is illustrated in FIG. 5 as comprising a two position mechanical switch 63a having an actuator-wiper arm 63a directly coupled to ground potential. With the mechanical switch 63a in an off position, ground potential is supplied to a terminal 138 that is coupled through a relatively low value resistor 139 to the terminal 53. In this position, the automatic scan circuit 63 prevents the voltage at the terminal 53 from ever reaching a high enough value to prevent clock pulses from passing through the NOR gate 137. When the switch 63a of the automatic scan circuit 63 is in a scan position, ground potential is removed from the terminal 138 and applied to a terminal 140 which is directly coupled to the terminal 58. Thus with the switch 63a in its scan position, high logic signals produced by the squelch delay circuit 52 at the terminal 53 will now result in blocking the passage of clock pulses through the NOR gate 137. Also, ground potential will continuously be applied to the terminal 58 and this will result in continuously producing an enable signal at the terminal 121 and an up control signal at the terminals 131 and 132. In this manner, the automatic scan circuit 63 causes the counters 113 and 114 to continuously receive clock pulses from the clock 136 and sequentially count these pulses in an up counting sequence until a high logic signal is produced at the terminal 53 which indicates that signals are being received by the CB receiver 13 on the channel to which that receiver is tuned to.

The counter 113 has a carry in terminal 141 and a carry out terminal 142 which is connected to a carry in terminal 143 of the counter 114. The terminal 141 is connected to ground through a resistor 144 and connected to the terminal 28 (which is high when the transmitter 12 is operative) through a resistor 145. The counters 113 and 114 have reset terminals 146 and 147 which are connected together and received their input from the illegal channel detector 119. The counters 113 and 114 also have count preset terminals 148 and 149, respectively. Counter 113 has output count terminals 150, 151, 152, and 153 which are all coupled to the read only memory circuit 115 and which sequentially register individual high logic signals corresponding to counts of 1, 2, 4, and 8, respectively. Counter 114 has two such output terminals designated 154 and 155 which register counts of 1 and 2 respectively. The terminals 154 and 155 are also directly coupled to the read only memory circuit 115. In the preferred embodiment of the present invention, the counters 113 and 114 are contemplated as being integrated circuit up/down counters identical to Motorola part No. MC14510. Both counters are identical to each other and corresponding terminals have generally been illustrated in identical positions in FIG. 5, except where this would unnecessarily lead to complicating the drawing.

With the counters 113 and 114 connected as previously recited, the counters will count the clock pulses they receive at the terminals 134 and 135 and register a resultant combined count on the output terminals 150 through 155. Each individual counter counts from 0 to 9 and upon the tenth count a zero count is registered as the output and a low logic signal is produced at the carry out terminal, terminal 142 for counter 113. The low carry out signal from counter 113 is coupled to the carry in terminal 143 of the counter 114 and allows this counter to respond to the same pulse which created the low carry out signal at the terminal 142, since the clock input terminals 134 and 135 are coupled together. Thus the counters 113 and 114 are connected in cascade, with counter 114 only counting every tenth pulse, and the counters have a capacity of registering a maximum count of 39 on the output terminals 150 through 155.

The logic signals present at the counter output terminals 150-155 are coupled to the read only memory circuit 115 which receives these signals and produces corresponding signals on the plurality of connections 60a that indicate to the frequency synthesizer 61 which of the discrete plurality of channels the CB receiver 13 or the CB transmitter 12 are to be tuned to. Read only memory circuits such as circuit 115 are commonly known to those of average skill in the art and are readily obtainable. Basically they receive one set of logic signals as inputs and produce a predetermined corresponding set of logic signals as outputs.

Output terminals 150 through 153 are directly connected to the digit driver 116 which monitors these terminals and produces a corresponding drive signal to the digit display 110 to produce a visual indication of the accumulated count indicated by the terminals 150 through 153. Digit driver 117 is directly coupled to the output terminals 154 and 155 and performs a similar function for the digit display 111. The preferred embodiment of the present invention contemplates using Motorola integrated circuits MC14558 as the digit drivers 116 and 117. The display 62 directly displays the exact count of the counters 113 and 114 and this directly corresponds to which one of the allowable CB channels has been selected.

When the CB transmitter 12 receives operable power, a high positive voltage is present at the power supply terminal 28. This high voltage will cause a positive signal to be received at the carry in terminal 141 of the counter 113 and this will positively prevent the counters 113 and 114 from counting any additional clock pulses during the operable condition of the CB transmitter 12. Thus the present invention provides for automatically totally inhibiting any possible change in the selected transmitter channel frequency during actuation of the transmitter. This means that the channel frequency of the CB transmitter 12 cannot possibly be changed during signal transmissions, regardless of the operative conditions of the automatic scan circuit 63 or the manual channel select switch 55. Thus accidentally changing of the transmitter frequency while the operator of the multi-channel communication device is transmitting is totally positively prevented. This is a feature which does not exist in any of the prior art manually tunable transmitters, since these transmitter do not provide for disabling the manual tuning of the transmitter during the transmission of a signal. Changing the transmitter frequency while transmitting is never intended by the operator of a mult-channel communication device and therefore only accidentally occurs. In prior art devices, this can occur when the manual tuning control is adjusted at the same time a signal is being transmitted. Whern the operator of the multi-channel device is unfamiliar with its operation or accidentally brushes against the manual tuning control while transmitting undesired changing of the transmission channel can occur. Changing transmitting frequencies while transmitting can possibly result in extremely large transmitter transients which may burn up the power output stages of the transmitter. In addition, such frequency switching while transmitting will create frequency splatter and therefore transmit many undesirable transient signals with illegal frequencies which will exist until a steady state condition is arrived at after the transmitter frequency has been switched. The present invention prevents the occurance of both of the above conditions.

The illegal channel detector 119 generally prevents the counters 113 and 114 from producing a count at the output terminals 150 through 155 which will not tune the CB transmitter and receiver to one of the predetermined plurality of discrete communication channels. Presently, there exist 23 citizen band communication channels. Since the counters 113 and 114, as they are connected, have a maximum count capability of 39, these excess counts must be prevented from selecting a frequency channel outside of the available 23 channels. This is accomplished by the illegal channel detector 119 and the zero channel detector 118 which consist of the following structure.

A NOR gate 156 has one input coupled to the terminal 153 and another input coupled to the terminal 152, its output being coupled as an input to a NAND gate 157. A NOR gate 158 has inputs coupled to the terminals 150 and 151 and its output coupled as another input to the NAND gate 157 and also to the input of an inverter 165. The output of the NAND gate 157 is coupled through an inverter 159 to the input of a NAND gate 160. A NOR gate 161 has inputs coupled to the terminals 154 and 155 and has its output coupled as another input to the NAND gate 160. The output of the NAND gate 160 is coupled to an input of a NAND gate 162 and the output of the NAND gate 162 is coupled to the preset enable terminals 163 and 164 of the counters 113 and 114, respectively. The components 158 through 162 generally comprise the zero channel detector 118.

The illegal channel detector 119 includes a NOR gate 166 receiving an input from the inverter 165 and having another input coupled to the terminal 154. The output of the NOR gate 166 is coupled as an input to a NOR gate 167 that receives another input from an inverter 168 that has its input coupled to the terminal 155. The output of the NOR gate 167 is coupled to the reset terminals 146 and 147 of the counters 113 and 114. The components 165 through 168 generally comprise the illegal channel detector 119.

The operation of the zero channel detector 118 and the illegal channel detector 119 is as follows. If the counters 113 and 114 register zero counts on their output terminals 150-155, then a low logic signal will be produced at the output of the NAND gate 160. This will cause the output of the NAND gate 162 to go high and create a high logic signal at the preset terminals 163 and 164 of the counters 113 and 114. With a high voltage on the preset terminals 163 and 164, the count of these counters is reset to a predetermined count depending upon the logic signals at the terminals 129 and 148 (for counter 113) and 130 and 149 (for counter 114). When the counters 113 and 114 have an accumulated count of zero in the terminals 150 through 155, and if the counters are counting in an up sequence, the combined count of the counters will typically be set to a count of one, whereas if the counters had been counting in a down sequence the combined count of the counters would be set to a count of 23. This is because during the preset enable mode of the counters, the logic signals present at the terminals 148 and 129 are transferred to the terminals 150 and 151, respectively, and the logic signals present at the terminals 149 and 130 are transferred to the output terminals 154 and 155, respectively. The operation of a preset enable mode of an up/down counter is well known to those of ordinary skill in the art and therefore will not be explained in any further detail. The creation of the logic signals present at the terminals 129, 130, 148 and 149 will be discussed subsequently.

The illegal channel detector 119 produces a high logic pulse at the output of the NOR gate 167 whenever the accumulated count at the terminals 150 through 155 is more than 23. When this occurs the high logic pulse produced by the NOR gate 167 will reset the counters 113 and 114 to a count of zero, and then the zero channel detector 118 will preset these counters to a count determined by the logic signals present at the terminals 129, 130, 148, and 149. Thus the combination of the illegal channel detector 119 and the zero channel detector 118 permits the counters 113 and 114 to continually sequentially count from 1 through 23 in either an up or down direction. Counts of zero or counts greater than 23 are prohibited and the counters will automatically be reset to an allowable count if any of these counts occur.

The reason for setting the maximum count of the counters at 23 is that only 23 citizen band channels are currently available. Obviously, if additional channels become available in the future, additional output terminals for the counter 114 can be provided and additional illegal channel detector circuitry will be necessitated to accommodate these channels. However, the present system is readily expandable to accommodate any number of additional channels having a predetermined discrete frequency. For any additional channels also a different read only memory circuit corresponding to the circuit 115 will also be required.

When power is applied to the multi-channel communication device by closing the on-off switch 16, a high positive voltage is applied to the terminals 18 and 19 of the mode selector circuit 20. A terminal 18' (which typically corresponds to terminal 18) is illustrated in FIG. 5 as being directly connected to the preset terminal 148. Thus whenever the count of the counter 113 is preset, the logic signal present at the terminal 18' will be transferred to the terminal 150. The terminal 18' is also coupled through a resistor 170 to a terminal 171 coupled to the input of the NAND gate 162. The terminal 171 is coupled to ground through a capacitor 172 and is coupled through a resistor 173 to a terminal 174 which is coupled to ground through a capacitor 175. The terminal 174 is coupled through an inverter 176 to the preset terminal 149 of the counter 114.

When terminals 18 and 18' are identical, a positive voltage is initially applied to the terminal 18' by closing the switch 16. Low voltages (logic states) will initially exist at the terminals 171 and 174, while a high logic state will initially exist at the terminal 149. These logic states will not change rapidly due to the slow charging of the capacitors 172 and 175. The low logic state at the terminal 171 will cause the NAND gate 162 to preset the counters 113 and 114 in response to the initial closing of the switch 16. This means that when the power switch 16 is closed, the counters 113 and 114 will be set to a predetermined count regardless of the count which they had registered during any previous actuation of the power switch 16.

In the preferred embodiment of the invention, the initial actuation of switch 16 will result in the counters 113 and 114 producing a count 11 since a high logic state will be initially presented to the terminal 149 during the initial preset of the counters. Subsequent presets of the counters 113 and 114 will set the combined count of these counters to either 1 or 23 depending on whether an up or down scan signal is being received at the terminals 129-132. This change in the preset count for subsequent presets occurs because a low logic state will eventually be present at the terminal 149 after the initial preset caused by the closing of the switch 16. Thus the present invention provides apparatus which can initially preset the tuning of the CB receiver and transmitter to channel 11, which has been proposed as a universal calling channel for citizen band communications. If channel 11 is adopted as the universal calling channel, all citizen band communications must originate on channel 11 and then subsequently be switched over to other channels after contact has been established. Thus the present invention provides a way to automatically tune the receiver and transmitter to this predetermined calling channel when power is initially supplied to the CB apparatus.

If the power on preset feature is not desired, the terminal 18' illustrated in FIG. 5 can be directly connected to the battery, whereby a low voltage is always provided at the terminal 149 and no power on preset mode exists. With this alternate connection, the tuning circuit 14 functions similarly to a mechanical switch in that the channel which the tuning circuit selects will be the same channel that the tuning circuit had previously selected during the last application of power to the CB receiver and transmitter.

FIG. 8 details an alternate construction for a portion of the multi-channel communication device in which the operator of the device can select either a preset upon power application mode or a channel memory mode for the tuning circuit 14. This is significant since in many applications the operator may want to initially tune his receiver and transmitter to a predetermined calling channel, but in other instances he may wish to constantly monitor one particular channel (not the calling channel) while intermittently applying power to his CB apparatus. The structure illustrated in FIG. 8 accomplishes this function and will be described in detail subsequently.

Referring now to FIG. 6, an alternate embodiment of the signal processing circuit 112 and the automatic scan circuit 63 is illustrated along with an embodiment of the automatic scan indicator 64. Identical reference numbers are used to identify components that correspond to identical components in other drawings.

The components 121 through 128 are connected in the alternate embodiment shown in FIG. 6 in an identical manner with the corresponding components illustrated in FIG. 5, with the sole exceptions being that the terminal 58 is not connected to the scan circuit 63 and is now directly connected to the anode of the diode 123. The terminal 121 is coupled through an inverter 180 to the input of a NOR gate 181 that has its output coupled as an input to another NOR gate 182. The output of the NOR gate 182 is directly connected to the terminals 134 and 135 of the counter 113 and 114 and the clock 136 is coupled as another input to the NOR gate 182. A NOR gate 183 has its output coupled as an input to the NOR gate 181 and has one input directly coupled to the terminal 53 and another input coupled to a $\overline{Q}$ terminal of a flip-flop 190 in the automatic scan circuit 63. The components 121-128, 136 and 180-183 comprise the alternate embodiment of the signal processing circuit 112 illustrated in FIG. 6.

The actuator 63a of the automatic scan switch in the automatic scan circuit 63 as illustrated in FIG. 6 as being a push button momentary contact switch which is normally spring biased such that ground potential is not applied to a terminal 191 until the actuator 63a is depressed. Upon release of manual pressure on the actuator 63a, the actuator will revert to its rest position in which ground potential is not applied to the terminal 191. A resistor 192 is coupled between the terminal 191 and an internal terminal 193 that is directly connected to a clock pulse input terminal of the flip-flop 190. The terminal 193 is coupled to ground through a capacitor 194 and is coupled to the positive voltage terminal 124 through a capacitor 195 connected in parallel with a resistor 196. A reset terminal R of the flip-flop 190 is coupled to the output of a NOR gate 197 that has one input coupled to the terminal 28 through a capacitor 198 and another input coupled to the terminal 23 through a capacitor 199. A Q terminal of the flip-flop 190 is coupled through a resistor 200 to the base of an NPN transistor 201 having its collector coupled directly to the positive power supply terminal 18 and its emitter coupled through a resistor 202 connected in series with the light 64a to ground. The components 200–202 and 64a generally comprise the visual automatic scan mode indicator 64, while the components 190 through 199 generally comprise the automatic scan circuit 63 along with the switch 63a.

It should be noted that the magnitude of the resistor 196 is typically 100K ohms, whereas the magnitude of the resistor 192 is typically 150 ohms. Thus the automatic scan switch 63a, including the actuator 63a, and the components 192, 195, and 196 form a switch bounce eliminator assembly substantially identical to that formed by the manual channel select switch 55 and the components 122, 125, and 126. Once again manual actuation of a switch will rapidly cause the production of an enable signal, this time at the terminal 193. Subsequent deactuation of this switch due to switch bounce or due to release of manual actuator will only cause the voltage at the terminal 193 to slowly respond. Since this terminal is coupled as the input terminal to the flip-flop 190, the prevention of switch bounce becomes extremely important because extra switch actuation pulses caused by bounce will retrigger the flip-flop 190 and therefore not produce the desired results.

In the preferred embodiment of the present invention, it was experimentally determined that satisfactory switch bounce elimination occurs with just the use of the capacitor 195 in parallel with the resistor 196. However, the bounce elimination was significantly improved by using both the capacitor 195 and the capacitor 194. Evidently the use of both of these capacitors appears to significantly retard the possibilities of switch bounce transient signals triggering the flip-flop 190.

The operation of the embodiment illustrated in FIG. 6 is as follows. With ground potential applied to either of the terminals 58 or 59 by the manual select switch 55, an enable signal is produced at the terminal 121 which comprises a low logic state. This results in having the NOR gate 181 always produce a low logic output in response to the manual actuation of the channel select switch 55. Thus clock pulses from the clock 136 will always be passed to the counters 113 and 114 through the NOR gate 182 regardless of the signal present at the terminal 53 and regardless of the operative state of the automatic scan circuit 63. In the embodiment illustrated in FIG. 5, if the automatic scan circuit 63 was in a scan mode and a signal was being received on the channel being scanned, the automatic scan mode would have to be discontinued before the manual channel select switch 55 would again regain control over the counts of the counters 113 and 114. This is not the case with the embodiment shown in FIG. 6 as will now be explained.

The flip-flop 190 has two stable states as in characteristic of all flip-flops. In one stable state a high voltage is produced at the Q terminal which is coupled to the transistor 201 and results in turning on the scan indicating light 64a. In this same state, a low signal is produced at the $\overline{Q}$ and this signal is coupled as an input to the gate 183 which also receives signals from the squelch delay terminal 53. With no enable signal created at the terminal 121 by the manual channel select switch 55 and with a low logic signal produced at the $\overline{Q}$ terminal of the flip-flop 190, the NOR gate 182 will continually pass clock pulses to the counters 113 and 114 until the voltage at the terminal 53 goes high indicating that the receiver 13 is receiving a signal on the channel which has been selected. Clock pulses will not be passed to the counters during the reception of this signal so long as the logic states of the flip-flop 190 are not changed and so long as no enable signal is produced by the manual channel select switch 55 at the terminal 121.

If the actuator 55a of the manual select switch is momentarily brought into contact with the terminal 58, this will momentarily create an enable signal at the terminal 121 and allow the passage of a clock pulse to the counters 113 and 114. This in turn results in incrementing the count of these counters and tuning the receiver to the next sequential channel while not disabling the automatic scan mode which is controlled by the scan circuit 63. This condition is something which was not true of the embodiment illustrated in FIG. 5. Thus the application and release of manual pressure applied in a single direction against actuator 55a can override the automatic scan mode without disabling it.

When the CB transmitter 12 is actuated, a high voltage is produced at the terminal 28 and this creates a turn on pulse which is coupled to gate 197 and results in resetting the flip-flop 190 to a stable state. This stable state always corresponds to a low logic signal being created at the terminal Q and a high logic signal being created at the terminal $\overline{Q}$. Thus the automatic scan apparatus is disabled upon actuation of the CB transmitter. Certainly if the operator of the multi-channel communication device 10 has decided to actuate his transmitter, he is no longer interested in scanning all of the CB channels to detect any transmissions taking place. He is primarily interested in determining if there will be a response to his transmission, and therefore he does not wish to change the channel frequency of his CB apparatus after his transmission. In addition, the flip-flop 190 is similarly reset whenever power is initially applied to the terminal 23. Thus the flip-flop 90 is reset whenever the CB transmitter is actuated and whenever the operator of the multi-channel communication device decides to initially supply power, by movement of the actuators 18a or 19a in the mode selector circuit 20, to either his CB receiver or transmitter. While FIG. 6 illustrates capacitors 198 and 199 as creating reset pulses for the flip-flop 190, the use of any equivalent circuitry is contemplated.

Referring now to FIG. 7, an alternate embodiment of the apparatus illustrated in FIG. 6, and also illustrated as part of the apparatus in FIG. 5, is shown. Identical reference numbers have been used to designate corresponding identical components. The signal processing circuit 112 shown in FIG. 7 is identical in every respect to the signal processing stage 112 illustrated in FIG. 5. The automatic scan indicator circuit 64 shown in FIG. 7 is identical in every respect to the circuit 64 shown in FIG. 6. FIG. 7 combines these two prior circuits with a slight modification of the automatic scan circuit 63 as it was previously shown in FIG. 6. This modification will enable the automatic scan circuit 63 in FIG. 7 to function without being overriden by the actuator 55a of the manual channel select switch. In this respect, the operation of the circuit in FIG. 7 is identical to that of the circuit illustrated in FIG. 5.

In FIG. 7, the circuit 63 includes components 190–196 connected as shown in FIG. 6. The actuator 63a again supplies pulses to the clock input terminal of the flip-flop 190 by use of the bounce eliminator circuit comprising the components 191 through 196. The $\overline{Q}$ terminal of the flip-flop 190 is connected through a diode 205 to the cathode of the diode 120, the cathode of diode 205 being directly connected to the $\overline{Q}$ terminal of flip-flop 190.

The terminal 53, besides being coupled as an input to the NOR logic gate 137, is also connected through a resistor 206 connected in series with a diode 207 to the Q terminal of flip-flop 190. The cathode of diode 207 is directly connected to the Q terminal. This connection prevents the voltage at the terminal 53 from inhibiting clock pulses whenever the automatic scan circuit 63 is not in an automatic scan mode. This occurs because whenever the scan circuit 63 is not in a scan mode, the voltage at the Q terminal of the flip-flop is low and prevents a high signal from being created at the terminal 53.

The Q terminal of the flip-flop 190 again supplies the drive signal to the base of the transmitter 201 which produces a visual indication for the automatic scan indicator 64. The Q terminal of the flip-flop 190 is also coupled as an input to a NAND gate 208 which receives another input directly from the transmitter supply terminal 28. The output of the NAND gate 208 is coupled to ground through a resistor 209 and to the terminal 193 through a diode 210 which has its anode directly connected to the terminal 193. This circuit configuration provides for terminating the automatic scan mode of the circuit 63 whenever the CB transmitter 12 receives power. This termination is now accomplished by not resetting the flip-flop 190 by the use of the reset terminal R (as was shown in FIG. 6), but by creating an additional toggle pulse upon transmitter actuation for the flip-flop 190 at the clock input terminal of the flip-flop.

The terminal 23 is coupled through a capacitor 211 and an inverter 212 to the reset terminal R, and this produces a reset pulse for the flip-flop 190 upon the initial application of a positive voltage to the terminal 23. This insures that the automatic scan circuit 63 will not be in a scan mode when power is first applied to the CB apparatus via the mode selector circuit 20.

Referring now to FIG. 8, an alternate embodiment for a portion of the multi-channel communication device 10 illustrated in FIG. 1 is shown. In this alternate embodiment, the battery 15 is not only coupled to the switch 17 and supplies a positive voltage to the switch, which in turn selectively supplies this voltage to the regulator 17 and to the terminals 18 and 19 of the mode selector circuit 20, but the battery is also coupled to a memory switch 215 and supplies a positive supply voltage to the switch 215, which comprises a two position mechanical switch having an actuator 215a which can selectively apply the battery voltage to a terminal 216 in accordance with the operative position of the actuator 215a. The terminal 216 is coupled to a regulator 217 (shown dashed) consisting of a resistor 218 coupled between the terminal 216 and an internal terminal 219. A zener diode 220 is provided between the terminal 219 and ground and is connected such that a constant zener voltage is provided at the terminal 219. The components 218-220 comprise the regulator 217. The terminals 18 and 19 are directly connected to the terminal 18' through an isolation diode 221 and the terminal 219 is also connected to the terminal 18' through another isolation diode 222. The diodes 221 and 222 have their cathodes directly connected to terminal 18' and a capacitor 223 is coupled between the terminal 18' and ground. It should be remembered that the terminal 18', as illustrated in FIG. 5, represents the power supply terminal that controls the turn on preset modes of the counters 113 and 114.

As previously mentioned, if the terminal 18' were directly connected to the battery 15, the counters 113 and 114 would have a memory function and therefore they would retain any previous count they had until additional clock pulses were received. With the terminal 18' directly connected to the terminal 18, it was previously mentioned that the counters 113 and 114 would be preset to select a calling channel of 11 for the CB transmitter 12 and receiver 13 upon the initial application of power to the communication device by the on-off switch 16. FIG. 8 provides for combining both of these functions with a single apparatus that can selectively elect to have the counters 13 and 14 either remember their previous count or be preset to a specific calling channel upon actuation of the on-off switch 16.

The operation of the components in FIG. 8 is as follows. With no battery voltage being supplied to the terminal 216 by the memory switch 215, which corresponds to the switch 72 in FIG. 2, the CB portion of the communication device 10 will be preset to channel 11 upon actuation of the switch 16. This is because a power on step pulse will pass through the diode 221 to the terminal 18' upon actuation of switch 16. This causes the counters 113 and 114 to be preset. The isolation diode 222 prevents the output of the regulator 17 from disturbing the regulator circuit 217. When the memory switch 215 connects the battery 15 directly to the terminal 216, the regulator 217 will continually supply a positive voltage to the terminal 18' through the diode 222. Now the isolation diode 221 prevents this positive voltage from affecting the operation of the regulator 17 and also from supplying power to the terminals 18 and 19 of the mode selector circuit 20. If the on-off switch 16 is subsequently turned on, it is contemplated that the regulator 17 will supply a slightly larger voltage to the terminal 18' through the diode 221. This slightly larger voltage at the terminal 18' will not result in presetting the tuning circuit 14 to the preset calling channel. This is because a high logic state already existed at the terminal 18' via the switch 215 and regulator 217. Thus the circuit of FIG. 8 enables the operator of the multi-channel communication device 10 select either a preset feature or a memory feature for the CB tuning apparatus by use of the switch 215.

FIGS. 9A and 9B are graphs showing waveforms that illustrate the operation of the bounce eliminator circuitry which is used in conjunction with the actuator 55a of the manual channel select switch and the actuator 63a in the automatic scan circuit 63. In both figures, the vertical axis represents voltage magnitude and the horizontal magnitude represents time. The illustrated waveforms depict typical voltages created at the terminals 121 and 193 in response to switch actuator movement. The FIGS. 9A and 9B will only be discussed with reference to the terminal 121 and switch 55 since the operation of switch 63a and the waveforms at the terminal 193 are identical.

Prior to movement of the actuator 55a into contact with either the terminals 58 or 59, the voltage at the terminal 121 will be equal to the voltage at the terminal 124 which is a high positive voltage. At time $t_0$, ground is connected to either the terminal 58 or 59 by movement of the actuator 55a. This results in a rapid charging of the capacitor 125 through the low resistor 122 and one of the diodes 120 or 123. The result is the rapid creation of a minimum voltage $V_1$, almost zero, at terminal 121. At a much later $t_1$, the actuator 55a is returned to its rest position and this results in a slowly rising voltage at the terminal 121 due to the discharging of the capacitor 125 through the resistor 126.

FIG. 9A illustrates the voltage at terminal 121 when no switch bounce occurs. FIG. 9B illustrates the waveform created by the bounce eliminator circuit assuming that switch bounce does occur at a time $t_2$ subsequent to the closing of the switch at $t_0$ wherein the switch bounce terminates at a later time $t_3$. The times $t_2$ and $t_3$ occur relatively soon after the time $t_0$. At the time $t_2$, the voltage at the terminal 121 will gradually begin to rise. However, since at a subsequent time $t_3$ the switch contact will be remade, the voltage at terminal 121 will again rapidly fall to the minimum value $V_1$ and remain there until actual movement of the actuator 55a back into its at rest position. Thus the waveform 9B illustrates that the voltage produced at the terminal 121 will be effectively immune to switch bounce due to the rapid attack and slow decay of the voltage produced at the terminal 121 in response to actuator movement. This is the heart of the bounce eliminator circuit used in conjunction with the manual actuator 55a of the channel select switch 55. This circuit is also used in the embodiments of the automatic scan switch 63a which are shown in FIGS. 6 and 7.

FIG. 10 illustrates a typical practical embodiment of the squelch trigger circuit 50 and the squelch delay circuit 52 of the multi-channel communication device 10 illustrated in FIG. 1. Identical reference numbers have been used to identify identical corresponding components illustrated in other drawings.

The squelch trigger circuit 50 comprises a potentiometer 225 having its fixed resistance element coupled between the terminal 49 and ground and its wiper arm directly coupled to the base of an NPN transistor 226. The collector of the transistor 226 is directly coupled to the terminal 51 and is coupled to the receiver voltage supply terminal 27 through a resistor 227. An NPN transistor 228 has its base coupled to the collector of the transistor 226 via a voltage divider network 229 comprising two resistors. The collector of the transistor 228 is directly connected to the terminal 27 and its emitter is connected to the emitter of the transistor 226, with both of these emitters connected to ground through a resistor 230. The components 225 through 230 generally comprise the squelch trigger circuit 50, which essentially receives the ACC signal at the terminal 49, compares it to an adjustable threshold level and produces a high output voltage at the terminals 51 and 32 if the AGC signal at the terminal 49 indicates the presence of a received CB signal. The high voltage at the terminal 32 will forward bias the diode 82 in the squelch gate and signal select circuit 25 and result in passing the detected audio of this received CB signal to the speaker 36.

The potentiometer 25 generally corresponds to the adjustable squelch control which is present on most two-way communication devices. Typically this control is accessible to the operator of the communication device in the form of a rotary adjustable knob. In FIG. 2, a rotary knob has been illustrated and is designated by the reference numeral 225 to indicate the adjustable squelch potentiometer.

Basically, the squelch trigger circuit 50 is merely a variable voltage comparison circuit which produces a high output whenever a received voltage differs from an internal reference voltage by at least a predetermined difference.

The squelch delay circuit 52 includes a resistor 231 coupled in series with a diode 232 between the terminal 51 and an internal terminal 233 which is coupled to ground through a capacitor 234. The cathode of the diode 232 is directly connected to the terminal 233 which is also coupled through a resistor 235 to the base of an NPN transistor 236. The transistor 236 has its emitter directly coupled to the base of an NPN transistor 237 and the collector of the transistor 236 is coupled to the voltage supply terminal 27 through a resistor 238. The transistor 237 has its emitter coupled to ground through a resistor 239 and has its collector coupled to the terminal 27 through a resistor 240. An NPN transistor 241 has its base directly connected to the collector of the transistor 237, its emitter directly coupled to ground, and its collector directly coupled to the terminal 53 and coupled through a resistor 242 to the terminal 27.

Essentially, in response to the production of a high voltage at the terminal 51 which indicates the reception of a CB signal by the receiver 13, the capacitor 234 is rapidly charged through the path consisting of the resistor 231 and the diode 232. The resistor 231 has a typical magnitude of approximately 1K ohms. When the high voltage at the terminal 51 terminates indicating that a CB signal is no longer is being received, the diode 232 prevents discharge of the capacitor 234 through the resistor 231. Instead, the capacitor 234 must now discharge through the high impedance circuit formed by the resistor 235 (typically having a magnitude of 3M ohms) and the input impedance of the transistor 236. When the capacitor 234 was initially charged up by the high voltage at the terminal 51, this turned on the transistors 236 and 237 and turned off the transistor 241. Thus a high voltage was produced at the terminal 53 in response to a high voltage at the terminal 51. When the signal at the terminal 51 terminates, the transistors 236 and 237 will remain on due to the slow discharging of the capacitor 234. Thus the high voltage at the terminal 53 will be maintained for an appreciable time after the termination of the signal at the terminal 51. This delay time is typically four seconds, as was previously mentioned.

In summary, a multi-channel communication device has been provided which represents a vast improvement over the prior art devices. The multi-channel communication device has numerous advantages over the prior art circuits and each advantage has been previously discussed with specific reference to the preferred embodiments of the invention as illustrated in the accompanying drawings. While specific embodiments of the present invention have been shown and described, further modifications and improvements will occur to those skilled in the art. All such modifications which retain the basic underlying principles disclosed and claimed herein are within the scope of this invention.

We claim:

1. A multi-channel communication device operable at a predetermined plurality of discrete priority channel frequencies, the device comprising:

means for receiving signals on a single nonpriority communication channel and producing audible signals in response thereto, at least one priority channel receiver means tunable in discrete steps for receiving signals on any selected one of a predetermined plurality of discrete priority channels;

means coupled to said priority receiver means for selectively generating, in discrete steps in response to control signals, one of a predetermined plurality of discrete channel signals, each of said channel signals having a different frequency, said one selectively generated channel signal selecting a corresponding one of said priority channels for said priority receiver means;

means, coupled to said generating means, for producing a visual indication identifying the selected channel of said priority receiver means;

automatic tuning means coupled to said generating means for supplying said controls signals thereto for continuously automatically causing said generating means to produce each of said discrete priority channel signals in a predetermined sequence, said automatic tuning means being operative in response to a scan enable signal, said automatic tuning means including automatic scan switch means having a manual actuator with at least a first and second position, said automatic scan switch means producing said scan enable signal in response to a movement of said actuator from said first to second position;

means coupled to said priority receiver means and said automatic tuning means for producing a first inhibit signal for inhibiting further automatic sequencing during the reception of received priority channel signals by said priority receiver means on said one selected priority channel;

means coupled to said nonpriority receiving means and said priority receiver means for interrupting the audible signals related to received nonpriority channel signals and producing audible signals related to received priority channel signals during the reception of signals by said priority receiver means on said one selected priority channel;

manual tuning means coupled to said generating means for manually selecting any one of said plurality of discrete channel signals by supplying said control signals to said generating means;

transmitter means coupled to said generating means for selectively transmitting signals on a selected channel corresponding to the one selected priority channel that said priority receiver means is tuned to, said transmitter means coupled to said priority receiver means for producing a second inhibit signal for inhibiting any manual and automatic priority receiver means tuning whenever said transmitter means transmits signals;

power switch means coupled to said priority receiver means for supplying operative power to said priority receiver means upon actuation of said power switch means; and first circuit means coupled to said power switch means and said generating means for causing said priority receiver means to be initially tunably controlled by said manual tuning means and to be initially tuned to a preselected one of said priority channels after an actuation of said power switch means, regardless of which priority channel said priority receiver means had last previously been tuned to during any previous actuation of said power switch means, whereby the priority receiver means initially monitors the one preselected channel after actuation of said power switch means and before any manual tuning of said receiver means;

said manual tuning means including first switch means, coupled to said generating means, having a manual actuator with at least a first, second, and third mechanical position, said first switch means providing an up control signal with its actuator in said first position, a down control signal with its actuator in said second position and an enable control signal with its actuator in any one of said first and second positions;

said generating means receiving all of said control signals provided by said first switch means and continuously selectively generating in discrete steps in a first predetermined sequence, each of the discrete channels signals in said predetermined plurality of channel signals as said one channel signal in response to the existence of both said enable and up signals, and continuously selectively generating, in discrete steps in a second predetermined sequence, each said discrete channel signals as said one channel signal in response to the existence of both said enable and down signals, said up and down signals selecting one of said first and second sequences and said enable signal enabling said generating means to selectively generate another of said plurality of different channel signals as said one channel signal, whereby every channel signal is readily selectable by a single actuator causing any one of two distinct channel signal scanning sequences;

said manual tuning means also including a first resistor having magnitude, a first end terminal coupled to a first voltage potential, and a second end terminal, and a capacitor coupled between said second end terminal and a reference voltage potential, said first switch means providing a low resistance path substantially less than the magnitude of said first resistor between said second end terminal and a second voltage potential, different from said first voltage potential, in both of said first and second mechanical positions and providing a high resistance path substantially greater than the magnitude of said first resistor between said second end terminal and said second voltage potential with the actuator in its third mechanical position, the voltage at said second end terminal determining said enable signal, whereby a rapid change in the voltage at said second end terminal is created in response to the actuator being initially moved into said first and second mechanical positions from said third mechanical position and said resistor and said capacitor minimize the effect of switch bounce on the voltage at said second end terminal.

2. A multi-channel communication device operable at a predetermined plurality of discrete channel frequencies, the device comprising:

means for selectively generating, in response to control signals, one of a predetermined plurality of discrete channel signals, each of said channel signals having a different frequency, said one selectively generated channel signal determining the operative channel frequency of said communication device;

means, coupled to said generating means, for producing a visual indication identifying the operative frequency of said communication device; and first switch means, coupled to said generating means, having a manual actuator with at least a first and second mechanical position, said first switch means providing an up control signal with its actuator in said first position, a down control signal with its actuator in said second position and an enable control signal with its actuator in both said first and second positions;

said generating means receiving all of said control signals provided by said switch means and continuously selectively generating, in discrete steps in a first predetermined sequence, each of the discrete channels signals in said predetermined plurality of channel signals as said one channel signal in response to the existence of both said enable and up signals, and continuously selectively generating, in discrete steps in a second predetermined sequence, each of said discrete channel signals as said one channel signal in response to the existence of both said enable and down signals, said up and down signals selecting one of said first and second sequences and said enable signal enabling said generating means to continuously select different channel signals as said one channel signal, in the sequence selected by said up and down control signals, only as long as said enable signal exists, whereby any of said plurality of channel signals is readily selectable by a single actuator causing any one of two distinct channel signal scanning sequences;

wherein said first switch means includes a bounce eliminator circuit that rapidly creates said enable control signal in response to the movement of said actuator into said first and second mechanical positions, said bounce eliminator circuit comprising;

a first resistor having a magnitude, a first end terminal coupled to a first voltage potential and a second end terminal, and a capacitor coupled between said second end terminal and a reference voltage potential, and said first switch means having a third mechanical position for its actuator, said first switch means providing a low resistance path substantially less than the magnitude of said first resistor between said second end terminal and a second voltage potential, different from said first voltage potential, in both of said first and second mechanical positions and providing a high resistance path substantially greater than the magnitude of said first resistor between said second end terminal and said second voltage potential with the actuator in its third mechanical position, the voltage at said second end terminal determining said enable signal, whereby a rapid change in the voltage at said second end terminal is created in response to the actuator being initially moved into said first and second mechanical positions from said third mechanical position.

3. A multi-channel communication device according to claim 2 wherein said reference voltage potential and said first voltage potential are identical, said capacitor therefore being coupled in parallel with said first resistor.

4. A multi-channel communication device according to claim 3 wherein said actuator includes a contact directly coupled to said second voltage potential, said first switch means comprising a second resistor being coupled between said second end terminal and said actuator contact when said actuator is in said first mechanical position, said resistor being coupled through a diode to the contact of said actuator when said actuator is in said second mechanical position, said diode having anode and cathode terminals, one of which being directly connected to said second resistor and the other being connected to a voltage potential, other than said second voltage potential, through a third resistor, said enable signal being produced at said second end terminal and said up and down control signals being provided at said other terminal of said diode.

5. A multi-channel communication device operable in a plurality of different modes, said communication device comprising:

means for receiving a single nonpriority communication channel and producing audible signals in response thereto, means for sequentially scanning a receiver over a predetermined plurality of priority communication channels;

means coupled to said priority channel scanning means for inhibiting further priority channel scanning during the reception by said receiver of signals on the one of said priority channels being scanned;

means coupled to said nonpriority receiving means and said scanning priority means for interrupting the audible signals related to said nonpriority channel and producing audible signals related to said received priority channel signals during the reception of said signals by said receiver on the scanned priority channel; and means including an switch having a manual actuator coupled to said scan inhibiting means for overriding said scan inhibiting means and allowing said scan means to continue its scanning sequence in response to manual actuation of said switch during the reception of priority channel signals on the channel being scanned; and wherein said scanning means includes a counter having a count that determines the priority channel being scanned, said inhibit means preventing said counter from counting and actuation of said switch changing the count of said counter.

6. A multi-channel communication device operable on a plurality of predetermined channels, said communication device comprising:

at least one receiver means manually tunable by a first manual actuator for receiving signals on any selected one of a predetermined plurality of discrete channels, and receiver means producing audible signals related to the signals received on said selected channel;

means coupled to said receiver means for implementing an automatic scan tuning mode which comprises continuously automatically tuning, in discrete steps, said receiver means to each of said discrete channels in a predetermined sequence, said automatic tuning mode being implemented in response to the existence of a scan enable signal, said automatic tuning means including switch means having a second manual actuator with at least a first and second position, said switch means producing and maintaining said scan enable signal in response to an initial manual movement of said second actuator from said first to second position;

said automatic scan tune mode implementing means including means coupled to said receiver means for automatically producing, as part of said automatic scan tuning mode, a first inhibit signal for temporarily inhibiting, during the existence of said automatic scan tuning mode, further automatic channel tuning during and in response to the reception of a received channel signal by said receiver means of said channel that said receiver means is tuned to and automatically reinstating said automatic scan tuning sequence subsequent to and in response to the termination of the reception of the channel signal; and transmitter means for selectively transmitting signals on a selected channel corresponding to the selected channel that said receiver means is tuned to, said transmitter means coupled to said receiver means for producing a second inhibit signal for terminating said automatic scan tuning mode in response to actuation of said transmitter means, wherein said automatic scan tuning mode is terminated by said second inhibit signal transmitting said scan enable signal, and subsequent continuous automatic tuning in said automatic scan tuning mode is thereby prevented until said scan enable signal is recreated by again moving said switch means second actuator, whereby the transmission of signals will terminate the automatic scan tuning mode and prevent the automatic resumption of scan tuning thereafter.

7. A multi-channel communication device according to claim 6 which includes means coupled to the switch means of said automatic tuning means for visually indicating by illumination, the existence of said scan enable signal, thereby providing a visual indication of the automatic scan tuning mode of operation of the communication device.

8. A multi-channel communication device according to claim 7 wherein the second actuator of said switch means is normally biased into said first position and constant manual pressure is required to hold said actuator in said second position.

9. A multi-channel communication device according to claim 8 wherein said switch means includes a bistable circuit means that produces and terminates said scan enable signal alternately in response to each movement of said second actuator into said second position.

10. A multi-channel communication device according to claim 9 wherein said bistable circuit means terminates said scan enable signal in response to said transmitter means transmitting signals.

11. A multi-channel communication device according to claim 9 wherein said device has an on-off switch for supplying operative power to said device and said switch means always produces said scan enable signal in response to the first movement of said switch means actuator into said second position after the device receives operative power from said on-off switch.

12. A multi-channel communication device according to claim 9 wherein said bistable circuit means comprises a flip-flop circuit having an output corresponding to said scan enable signal, the output of said flip-flop circuit being alternately set between high and low states in response to each movement of said second actuator into said second position, and said flip-flop always being reset to only one of said high and low states in response to each actuation of said transmitter means.

13. A multi-channel communication device according to claim 12 wherein said second actuator comprises a spring biased pushbutton.

14. A multi-channel communication device according to claim 13 wherein said flip-flop circuit output is always reset to said one of said high and low states in response to actuation of an on-off switch which provides operative power to said communication device, wherein said scan enable signal is produced in response to the first movement of said second actuator into said second position after the communication device receives operative power from said on-off switch.

15. A multi-channel communication device according to claim 6 which includes manual switch means, which comprises said first manual actuator, coupled to said receiver means for manually selecting the channel that said receiver means is tuned to, said first manual actuator with at least a first and second position, movement of said first actuator into one its first and second positions, when automatic tuning is inhibited by said first inhibit signal, causing said receiver means to select a new channel and reinstating said automatic tuning sequence of said receiver means.

16. A multi-chanel communication device according to claim 6 which includes manual switch means including said first manual actuator having a plurality of mechanical positions, said first actuator coupled to said receiver means for manually selecting the channel that said receiver is tuned to, and wherein said automatic tuning means is such that when said automatic tuning means is enabled, the operation of said automatic tuning means is independent of the mechanical positions of said first manual actuator.

17. A multi-channel communication device comprising:

tunable receiver means for receiving signals on any one of a predetermined plurality of discrete priority channels and producing audible signals in response thereto;

power switch means coupled to said receiver means for supplying operative power to said receiver means upon actuation of said power switch means;

means coupled to said receiver means for manually selectively tuning said receiver means to any one of said priority channels for signal reception by said receiver means to signals on said selected channel; and first circuit means coupled to said power switch means for causing said receiver means to be subsequently tunably controlled by said manual tuning means but to be initially tuned to a preselected one of said priority channels after an actuation of said switch means, regardless of which priority channel said receiver means had last previously been operatively tuned to during any previous actuation of said power switch means, whereby the receiver means is initially tuned to the one preselected channel after actuation of said power switch means and before any manual tuning of said receiver means and wherein said manually selectively tuning means includes a counter and a manual switch means that selectively supplies said counter with pulses for counting by the counter, said counter coupled to said tunable receiver means and the count of said counter determining the one of said priority channels that said receiver means is tuned to, and wherein said first circuit means comprises a transient circuit coupled between said power switch means and said counter for initially causing the count of said counter to be set to a predetermined count by creating transient voltages in response to changes in the supplying of operative power by said power switch means;

the multi-channel communication device including transmitter apparatus coupled to said counter for selectively transmitting signals on channels which correspond to each of the priority channels that the receiver means is tuned to.

18. A multi-channel communication device according to claim 7 wherein said transient circuit includes at least one capacitor and wherein said transient voltages that initially set the count of said counter are created in response to the actuation of said power switch means.

19. A multi-channel communication device comprising:

tunable receiver means for receiving signals on any one of a predetermined plurality of discrete priority channels and producing audible signals in response thereto;

power switch means coupled to said receiver means for supplying operative power to said receiver means upon actuation of said power switch means;

means coupled to said receiver means for manually selectively tuning said receiver means to any one of said priority channels for signal reception by said receiver means to signals on said selected channel;

first circuit means coupled to said power switch means for causing said receiver means to be subsequently tunably controlled by said manual tuning means but to be initially tuned to a preselected one of said priority channels after an actuation of said switch means, regardless of which priority channel said receiver means had last previously been operatively tuned to during any previous actuation of said power switch means, whereby the receiver means is initially tuned to the one preselected channel after actuation of said receiver means; and wherein said manually selectively tuning means includes a counter and a manual switch means that selectively supplies said counter with pulses for counting by the counter, said counter coupled to said tunable receiver means and the count of said counter determining the one of said priority channels that said receiver means is tuned to; and second circuit means for intially maintaining the count of said counter after actuation of said power switch means at the count which said counter last had during any previous actuation of said power switch means, and means for selecting one of said first and second circuit means for determining the initial count of said counter after actuation of said power switch means, wherein said second circuit means, when selected by said selecting means for determining the count of said counter, comprises structure for continuously providing a voltage to a terminal of said counter regardless of the operative state of said power switch means, and said first circuit means, when selected by said selecting means for determining the count of said counter, comprises structure for creating a transient voltage at said terminal upon said actuation of said power switch means.

20. A multi-channel communication device according to claim 19 wherein at least one of said first and second circuit means includes at least one diode for providing isolation between said first and second circuit means.

21. A multi-channel communication device according to claim 19 wherein said first and second circuit selecting means includes a manual switch having at least two mechanical positions.

22. A manual switch assembly for eliminating switch bounce, said switch assembly adaptable for use in a multi-channel communication device, said switch assembly comprising, at least one manual switch means having an actuator with at least a first and second mechanical position;

a first resistor having a magnitude, a first end terminal coupled to a first voltage potential and a second end terminal; and a first capacitor coupled between said second end terminal and a reference voltage potential;

said manual switch means providing a low resistance path substantially less than the magnitude of said first resistor between said second end terminal and a second voltage potential, different from said first voltage potential, with the actuator in said first mechanical position, and said switch means providing a high resistance path substantially greater than the magnitude of said first resistor between said second end terminal and said second voltage potential with the actuator in said second mechanical position, the voltage at said second end terminal being an output control signal of said switch assembly, whereby a rapid change in the control voltage at said second end terminal is created in response to the actuator being initially moved into said first mechanical position from said second mechanical position and switch bounce which may occur upon movement of the actuator into said second position does not substantially effect the voltage at said second end terminal due to the effect of said first resistor and said first capacitor.

23. A manual switch assembly according to claim 22 wherein said reference voltage potential and said first voltage potential are identical, said capacitor therefore being coupled in parallel with said first resistor.

24. A manual switch assembly according to claim 23 wherein said actuator is normally mechanically biased into said second mechanical position and said actuator requires constant manual pressure to hold said actuator in said first mechanical position.

25. A manual switch assembly according to claim 24 which includes a second capacitor coupled between said second end terminal and said second voltage potential.

26. A manual switch assembly according to claim 25 wherein said second voltage potential is ground.

27. A manual switch assembly according to claim 24 wherein said actuator has a third mechanical position, with constant mechanical pressure being required to hold said actuator in said third position, said switch means providing a low resistance path between said second end terminal and said second voltage potential with said actuator in said third position.

28. A manual switch assembly according to claim 27 wherein said actuator includes a contact directly coupled to said second voltage potential, said manual switch means including a second resistor being coupled between said second end terminal and said actuator contact when said actuator is in said second mechanical position, said resistor being coupled through a diode to the contact of said actuator when said actuator is in said third mechanical position, said diode having anode and cathode terminals, one of which being directly connected to said second resistor and the other being connected to a voltage potential, other than said second voltage potential, through a third resistor, whereby a signal is produced at said second end terminal that indicates movement of the actuator into one of said first and third positions and a signal is created at said other diode terminal which indicates which of said first and third mechanical positions created the signal at said second end terminal.

29. A multi-channel communication device operable on a plurality of predetermined channels, said communication device comprising:

at least one receiver means manually tunable for receiving signals on any selected one of a predetermined plurality of discrete channels, said receiver means producing audible signals related to the signals received on said one selected channel;

means coupled to said receiver means for implementing an automatic scan tuning mode which comprises continuously automatically tuning, in discrete steps, said receiver means to each of said discrete channels in a predetermined sequence, said automatic tuning mode being implemented in response to the existence of a scan enable signal, said automatic tuning means including switch means having a manual actuator with at least a first and second position, said switch means producing and maintaining said scan enable signal in response to an initial movement of said actuator from said first to second position;

said automatic scan tuning mode implementing means including means coupled to said receiver means for automatically producing, as part of said automatic scan tuning mode, a first inhibit signal for temporarily inhibiting, during the existence of said automatic scan tuning mode, further automatic channel tuning during and in response to the reception of a received channel signal by said receiver means on said one selected channel and automatically reinstating said automatic scan tuning sequence subsequent to and in response to the termination of the reception of the channel signal;

means, in addition to said switch means, for selectively terminating said automatic scan tuning mode while maintaining said receiver means operative, regardless of the position of said manual actuator, by terminating said scan enable signal, said scan enable signal remaining terminated until subsequent manual reactuation of said switch means manual actuator recreates said scan enable signal; and means coupled to the switch means of said automatic tuning means for visually indicating, by illumination, the existence of said scan enable signal, thereby providing a visual indication of the automatic scan tuning mode of operation of the communication device.

30. A multi-channel communication device according to claim 29 wherein the actuator of said switch means is normally biased into said first position and constant manual pressure is required to hold said actuator in said second position.

* * * * *